United States Patent
Shin et al.

(10) Patent No.: US 12,329,003 B2
(45) Date of Patent: Jun. 10, 2025

(54) DISPLAY DEVICE

(71) Applicant: Samsung Display Co., Ltd., Yongin-Si (KR)

(72) Inventors: Dong Hee Shin, Yongin-si (KR); Sun Kwun Son, Yongin-si (KR); Sang Yong No, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/626,344

(22) Filed: Apr. 4, 2024

(65) Prior Publication Data

US 2025/0040370 A1 Jan. 30, 2025

(30) Foreign Application Priority Data

Jul. 26, 2023 (KR) ........................ 10-2023-0097137

(51) Int. Cl.
*G09G 3/3233* (2016.01)
*H10K 59/131* (2023.01)
*H10K 59/88* (2023.01)
*G06V 40/13* (2022.01)

(52) U.S. Cl.
CPC ......... *H10K 59/131* (2023.02); *G09G 3/3233* (2013.01); *H10K 59/88* (2023.02); *G06V 40/1318* (2022.01); *G09G 2300/0819* (2013.01); *G09G 2300/0842* (2013.01); *G09G 2354/00* (2013.01); *G09G 2360/14* (2013.01); *G09G 2370/00* (2013.01)

(58) Field of Classification Search
CPC .... H10K 59/131; H10K 59/88; G09G 3/3233; G09G 2300/0426
See application file for complete search history.

(56) References Cited

U.S. PATENT DOCUMENTS

| | | |
|---|---|---|
| 11,158,258 B2 | 10/2021 | Cha et al. |
| 11,276,743 B2 | 3/2022 | Cho et al. |
| 2021/0257435 A1* | 8/2021 | Kim ................ H10K 59/131 |
| 2022/0285460 A1 | 9/2022 | Kim et al. |
| 2022/0406872 A1 | 12/2022 | Cho et al. |

FOREIGN PATENT DOCUMENTS

| | | |
|---|---|---|
| KR | 10-2021-0064483 A | 6/2021 |
| KR | 10-2022-0125839 A | 9/2022 |
| KR | 10-2022-0170387 A | 12/2022 |

* cited by examiner

*Primary Examiner* — Kevin M Nguyen
(74) *Attorney, Agent, or Firm* — Innovation Counsel LLP

(57) ABSTRACT

There is provided a display device comprises a substrate; a circuit layer; and an element layer. The element layer comprises light emitting elements disposed in emission areas of a display area of the substrate, and light sensing elements disposed in light sensing areas of the display area. The circuit layer comprises light emitting pixel drivers electrically connected to the light emitting elements; light sensing pixel drivers electrically connected to the light sensing elements; data lines electrically connected to the light emitting pixel drivers; first dummy lines extending in a first direction; second dummy lines extending in parallel with the data lines; and a reset control line electrically connected to the light sensing pixel drivers, extending in the first direction, transmitting a reset control signal for resetting the light sensing pixel drivers, and overlapping at least some of the first dummy lines.

19 Claims, 18 Drawing Sheets

DISPLAY DEVICE

CROSS-REFERENCE TO RELATED APPLICATION

This application claims priority from Korean Patent Application No. 10-2023-0097137 filed on Jul. 26, 2023 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device.

2. Description of the Related Art

As society becomes increasingly information-oriented, higher demands are placed on display devices for displaying images in various ways. For example, display devices are employed in various electronic devices such as smartphones, digital cameras, laptop computers, navigation devices, and smart televisions.

The display device may be a flat panel display device such as liquid crystal display device, field emission display device and light emitting display device. Examples of the light emitting display device may include an organic light emitting display device including organic light emitting elements, an inorganic light emitting display device including inorganic light emitting elements such as inorganic semiconductors, and a micro light emitting display device including micro light emitting elements.

The organic light emitting display device displays an image using light emitting elements, each including a light emitting layer made of an organic light emitting material. As described above, the organic light emitting display device implements image display using a self-light emitting element, and thus may have relatively superior performance in power consumption, response speed, luminous efficiency, luminance, and wide viewing angle compared to other display devices.

One surface of the display device may be a display surface including a display area in which an image is displayed and a non-display area that is a periphery of the display area. Emission areas emitting light with respective luminances and colors may be arranged in the display area.

SUMMARY

The display device may include data supply lines disposed in the non-display area and electrically connecting data lines to a display driving circuit.

In order to overcome the limitation in reducing the width of the non-display area due to the arrangement of the data supply lines, the display device may further include transmission bypass lines disposed in the display area and electrically connecting some of the data supply lines to some of the data lines.

The transmission bypass lines may include a first transmission bypass line extending in a first direction intersecting the data lines, and a second transmission bypass line extending in parallel with the data lines.

However, the first transmission bypass line in the first direction may be disposed adjacent to other lines extending in the first direction. As a result, there is a problem in that the data signal of the first transmission bypass line may be easily distorted by being coupled to the variable voltage level of other lines disposed around the first transmission bypass line.

In view of the above, aspects of the present disclosure provide a display device capable of reducing distortion of a data signal of a first transmission bypass line.

According to an aspect of the present disclosure, there is provided a display device comprises a substrate; a circuit layer disposed on the substrate; and an element layer disposed on the circuit layer. The substrate comprises a display area in which emission areas are arranged, and a non-display area disposed around the display area. The display area comprises a non-emission area between the emission areas, and light sensing areas disposed in the non-emission area. The element layer comprises light emitting elements disposed in the emission areas and light sensing elements respectively disposed in the light sensing areas. The circuit layer comprises light emitting pixel drivers electrically connected to the light emitting elements; light sensing pixel drivers electrically connected to the light sensing elements; data lines electrically connected to the light emitting pixel drivers; first dummy lines extending in a first direction intersecting the data lines; second dummy lines extending parallel to the data lines, each of the second dummy lines paired with one of the data lines; and a reset control line electrically connected to the light sensing pixel drivers, extending in the first direction, transmitting a reset control signal for resetting the light sensing pixel drivers, and overlapping at least one of the first dummy lines.

The display device may further include a display driving circuit outputting data signals to the data lines. The circuit layer may further include data supply lines disposed in the non-display area, and electrically connected between the data lines and the display driving circuit. A bypass area on one side of the display area may include a bypass middle area at a center of the bypass area, a first bypass side area between the bypass middle area and the non-display area, and a second bypass side area disposed between the bypass middle area and the first bypass side area. The data lines may include a first data line disposed in the first bypass side area, and a second data line disposed in the second bypass side area. The first dummy lines may include a first transmission bypass line electrically connected to the first data line. The second dummy lines may include a second transmission bypass line paired with the second data line and electrically connected to the first transmission bypass line. Among the data supply lines, a first data supply line transmitting the data signal to the first data line may be electrically connected to the first data line through the first transmission bypass line and the second transmission bypass line. Among the data supply lines, a second data supply line transmitting the data signal to the second data line may be directly electrically connected to the second data line. Among the first dummy lines, the first transmission bypass line may overlap the reset control line.

The circuit layer may further include a first power supply line and a second power supply line disposed in the non-display area, and transmitting a first power and a second power for driving the light emitting elements; and a first power line electrically connected between the light emitting pixel drivers and the first power supply line. One of the light emitting elements may be electrically connected between one of the light emitting pixel drivers and the second power. The one light emitting pixel driver may include a first transistor generating a driving current for driving the one light emitting element; a second transistor electrically connected between one of the data lines and a first electrode of the first transistor; a third transistor electrically connected between a gate electrode of the first transistor and a second electrode of the first transistor; a fourth transistor electrically connected between a first initialization power line for transmitting a first initialization power and the gate electrode of the first transistor; a fifth transistor electrically connected between the first power line and the first electrode of the first transistor; a sixth transistor electrically connected between the second electrode of the first transistor and the one light emitting element; a seventh transistor electrically connected between a second initialization power line for transmitting a second initialization power and the one light emitting element; and an eighth transistor electrically connected between a bias power line for transmitting a bias power and the first electrode of the first transistor.

The circuit layer may further include a read-out line electrically connected to the light sensing pixel drivers. One of the light sensing elements may be electrically connected between an element output node of one of the light sensing pixel drivers and the second power. The one light sensing pixel driver may include a ninth transistor configured to be turned on in response to a voltage level of the element output node; a tenth transistor electrically connected between a reset voltage line for transmitting a reset voltage and the element output node, and configured to be turned on in response to the reset control signal of the reset control line; and an eleventh transistor electrically connected between the read-out line and the ninth transistor.

The second transistor and the eleventh transistor may be turned on in response to a scan write signal of a scan write line. The scan write signal may be transmitted to the light emitting pixel drivers and the light sensing pixel drivers during each image frame. A blank period in which a voltage level of the scan write line is maintained at a turn-off level is disposed between consecutive image frame periods. A voltage level of the reset control line may vary during the blank period.

The reset control signal of the reset control line may be transmitted to the light sensing pixel drivers during the blank period between consecutive image frame periods.

A voltage level of the reset control line may vary in a first form during a first blank period, and vary in a second form opposite to the first form during a second blank period after the first blank period. At least one image frame period may be disposed between the first blank period and the second blank period.

The third transistor may be turned on in response to a gate control signal of a gate control line. The fourth transistor may be turned on in response to a scan initialization signal of a scan initialization line. The gate control signal and the scan initialization signal may be transmitted to the light emitting pixel drivers during each image frame period.

The reset control line may include an extension portion extending in the first direction; and a protrusion branching out from the extension portion and overlapping a channel portion of the tenth transistor.

The protrusion may form a loop with two connection points to the extension portion.

The first dummy lines may further include first auxiliary lines electrically connected to the second power supply line. The second dummy lines may further include second auxiliary lines electrically connected to the first auxiliary lines and the second power supply line.

Two of the first auxiliary lines may extend from both sides of the first transmission bypass line to the non-display area.

One of the second auxiliary lines may extend from one side of the second transmission bypass line to the non-display area.

According to an aspect of the present disclosure, there is provided a display device comprises a substrate; a circuit layer disposed on the substrate; and an element layer disposed on the circuit layer. The substrate comprises a display area in which emission areas are arranged, and a non-display area disposed around the display area. The display area comprises a non-emission area between the emission areas, and light sensing areas disposed in the non-emission area. The element layer comprises light emitting elements disposed in the emission areas and light sensing elements respectively disposed in the light sensing areas. A bypass area on one side of the display area comprises a bypass middle area at a center of the bypass area, a first bypass side area between the bypass middle area and the non-display area, and a second bypass side area disposed between the bypass middle area and the first bypass side area. The circuit layer comprises light emitting pixel drivers electrically connected to the light emitting elements, respectively; light sensing pixel drivers electrically connected to the light sensing elements, respectively; data lines electrically connected to the light emitting pixel drivers; a first transmission bypass line extending in the first direction crossing the data lines, and electrically connected to a first data line disposed in the first bypass side area among the data lines; a second transmission bypass line extending parallel to the data lines, paired with a second data line disposed in the second bypass side area among the data lines, and electrically connected to the first transmission bypass line; and a reset control line electrically connected to the light sensing pixel drivers, extending in the first direction, transmitting a reset control signal for resetting an element output node of each of the light sensing pixel drivers, and overlapping the first transmission bypass line.

The display device may further include a display driving circuit outputting data signals of the data lines. The circuit layer may further include data supply lines disposed in the non-display area, and electrically connected between the data lines and the display driving circuit. Among the data supply lines, a first data supply line transmitting the data signal of the first data line is electrically connected to the first data line through the first transmission bypass line and the second transmission bypass line. Among the data supply lines, a second data supply line transmitting the data signal of the second data line is directly electrically connected to the second data line.

The circuit layer may further include a read-out line electrically connected to the light sensing pixel drivers. One of the light emitting elements may be electrically connected between one of the light emitting pixel drivers and the second power. One of the light sensing elements may be electrically connected between an element output node of one of the light sensing pixel drivers and the second power. The one light emitting pixel driver may include a first transistor generating a driving current for driving the one light emitting element; a second transistor electrically connected between one of the data lines and a first electrode of the first transistor; a third transistor electrically connected between a gate electrode of the first transistor and a second electrode of the first transistor; a fourth transistor electrically connected between a first initialization power line for transmitting a first initialization power and the gate electrode of the first transistor; a fifth transistor electrically connected between a first power line for transmitting the first power and the first electrode of the first transistor; a sixth transistor electrically connected between the second electrode of the first transistor and the one light emitting element; a seventh transistor electrically connected between a second initialization power line for transmitting a second initialization power and the one light emitting element; and an eighth transistor electrically connected between a bias power line for transmitting a bias power and the first electrode of the first transistor. The one light sensing pixel driver may include a ninth transistor configured to be turned on in response to a voltage level of the element output node; a tenth transistor electrically connected between a reset voltage line for transmitting a reset voltage and the element output node, and configured to be turned on in response to the reset control signal of the reset control line; and an eleventh transistor electrically connected between the readout line and the ninth transistor.

The second transistor and the eleventh transistor may be turned on in response to a scan write signal of a scan write line. The scan write signal is transmitted to the light emitting pixel drivers and the light sensing pixel drivers during each image frame. A blank period in which a voltage level of the scan write line is maintained at a turn-off level may be disposed between consecutive image frame periods. A voltage level of the reset control line may vary during the blank period.

A voltage level of the reset control line may vary in a first form during a first blank period, and vary in a second form opposite to the first form during a second blank period after the first blank period. At least one image frame period is disposed between the first blank period and the second blank period.

The reset control line may include an extension portion extending in the first direction; and a protrusion branching out from the extension portion and overlapping a channel portion of the tenth transistor.

The protrusion may form a loop with two connection points to the extension portion.

A display device according to embodiments includes a substrate, a circuit layer disposed on the substrate, and an element layer disposed on the circuit layer. The substrate includes a display area in which emission areas are arranged, and a non-display area disposed around the display area. The display area includes a non-emission area which is a separation region between the emission areas, and light sensing areas disposed in parts of the non-emission area.

The element layer includes light emitting elements respectively disposed in the emission areas and light sensing elements respectively disposed in the light sensing areas.

The circuit layer includes light emitting pixel drivers that are electrically connected to the light emitting elements, respectively; light sensing pixel drivers that are electrically connected to the light sensing elements, respectively; data lines that are electrically connected to the light emitting pixel drivers; first dummy lines that extend in a first direction intersecting the data lines; second dummy lines that extend parallel to the data lines and are respectively paired with the data lines; and a reset control line that is electrically connected to the light sensing pixel drivers, extends in the first direction, and transmits a reset control signal for resetting the light sensing pixel drivers.

A bypass area on one side of the display area includes a bypass middle area at the center; a first bypass side area parallel to the bypass middle area in the first direction and in contact with the non-display area; and a second bypass side area disposed between the bypass middle area and the first bypass side area.

The data lines include a first data line disposed in the first bypass side area, and a second data line disposed in the second bypass side area.

The first dummy lines include a first transmission bypass line electrically connected to the first data line.

The second dummy lines include a second transmission bypass line that is paired with the second data line and electrically connected to the first transmission bypass line.

The first transmission bypass line overlaps the reset control line.

Further, according to embodiments, the voltage level of the reset control line may vary during a blank period between consecutive image frame periods. That is, the reset control signal of the reset control line may be outputted during at least one blank period.

For example, the reset control signal of the reset control line may be outputted during one blank period. In this case, the voltage level of the reset control line may be maintained at a turn-off level during each image frame period.

Alternatively, the reset control signal of the reset control line may be outputted during two or more blank periods disposed before and after at least one image frame period. In this case, the voltage level of the reset control line may be maintained at a turn-on level of the reset control signal during at least one image frame period disposed between two or more blank periods, and the voltage level of the reset control line may be maintained at the turn-on level during other image frame periods other than the at least one image frame period disposed between two or more blank periods.

As such, according to embodiments, the voltage level of the reset control line that transmits the reset control signal for resetting the light sensing pixel drivers may not vary and be maintained at a constant voltage during each image frame period. Further, the first transmission bypass line overlaps the reset control line.

Accordingly, although the constant voltage line for stably maintaining the data signal of the first transmission bypass line is not separately disposed, the data signal of the first transmission bypass line that overlaps the reset control line may be maintained relatively stably due to the reset control line maintained at a constant voltage during each image frame period. Accordingly, the distortion of the data signal may be reduced without adding a separate constant voltage line to reduce the coupling distortion of the first transmission bypass line.

In addition, since spot defects due to distortion of the data signal of the first transmission bypass line may be reduced, the display quality of the display device may be improved.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

Figure 1:
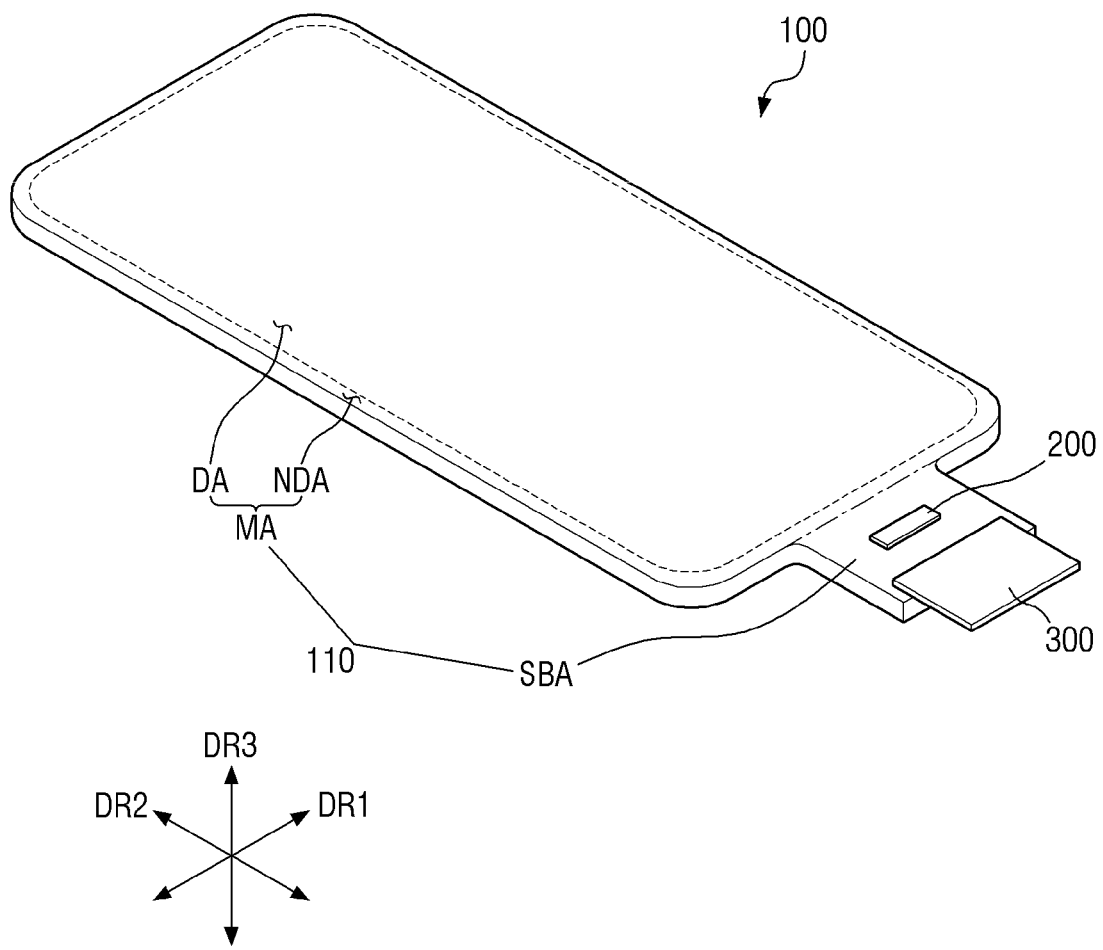
FIG. 1 is a perspective view illustrating a display device according to embodiments.

Embodiments of the present disclosure will now be described more fully hereinafter with reference to the accompanying drawings. The embodiments may, however, be provided in different forms and should not be construed as limiting. The same reference numbers indicate the same components throughout the present disclosure. In the accompanying figures, the thickness of layers and regions may be exaggerated for clarity.

Some of the parts that are not associated with the description may not be provided in order to describe embodiments of the present disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Coordinates are provided in the figures. The phrase "in a plan view" means an object portion is viewed in from the top, in a third direction DR3 as will be explained below. The phrase "in a schematic cross-sectional view" means an object portion is viewed from the side as though the product is cut in a plane that is partially defined by the third direction DR3. The terms "overlap" or "overlapped" mean that a first object may be above or below a second object. Additionally, the term "overlap" may include layer, stack, face or facing, extending over, covering, or partly covering or any other suitable term as would be appreciated and understood by those of ordinary skill in the art. The expression "not overlap" may include meaning such as "spaced apart from" or "distanced from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the spirit and scope of the present disclosure herein.

The terms "about" or "approximately," as used herein, is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, terms used herein (including technical and scientific terms) have the same meaning as commonly understood by those skilled in the art to which the present disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

Figure 2:
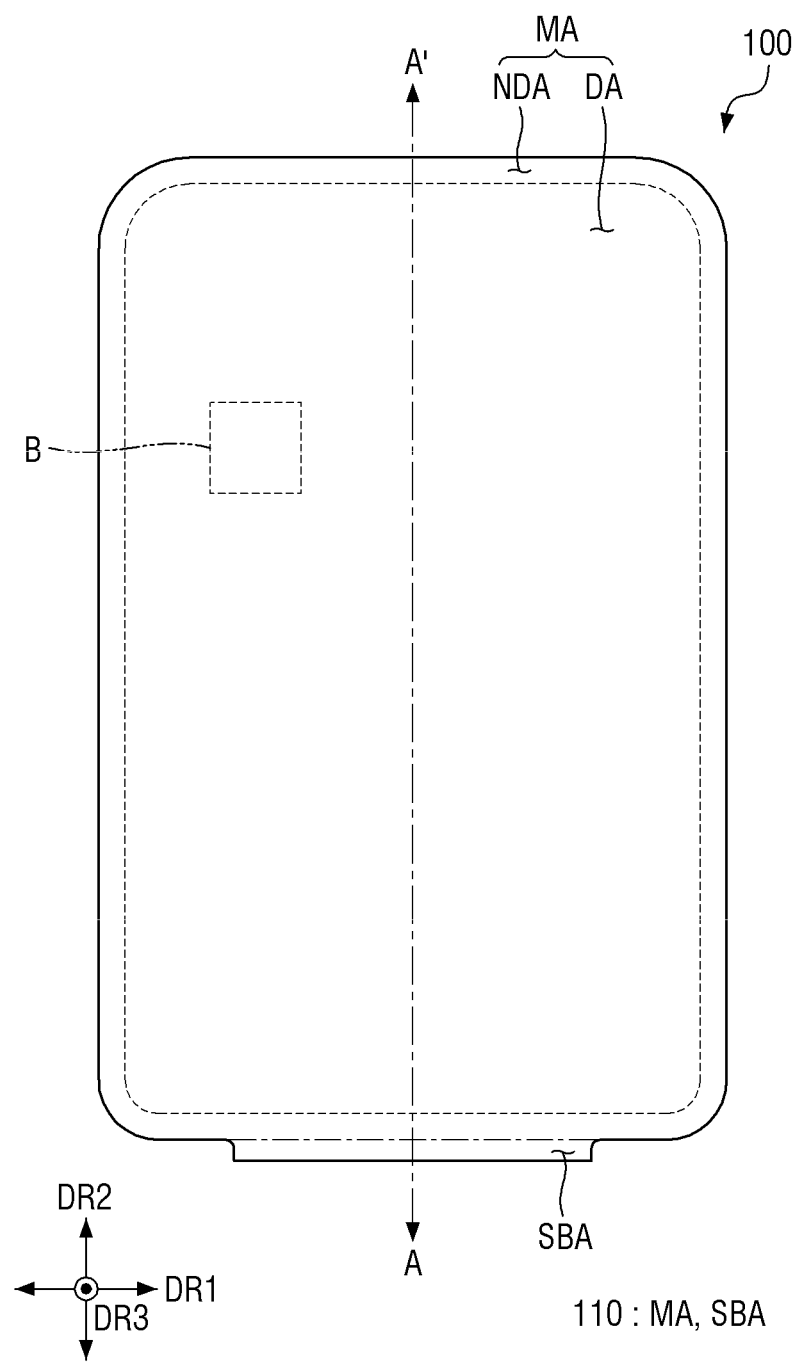
FIG. 2 is a plan view illustrating the display device of FIG. 1.
Figure 3:
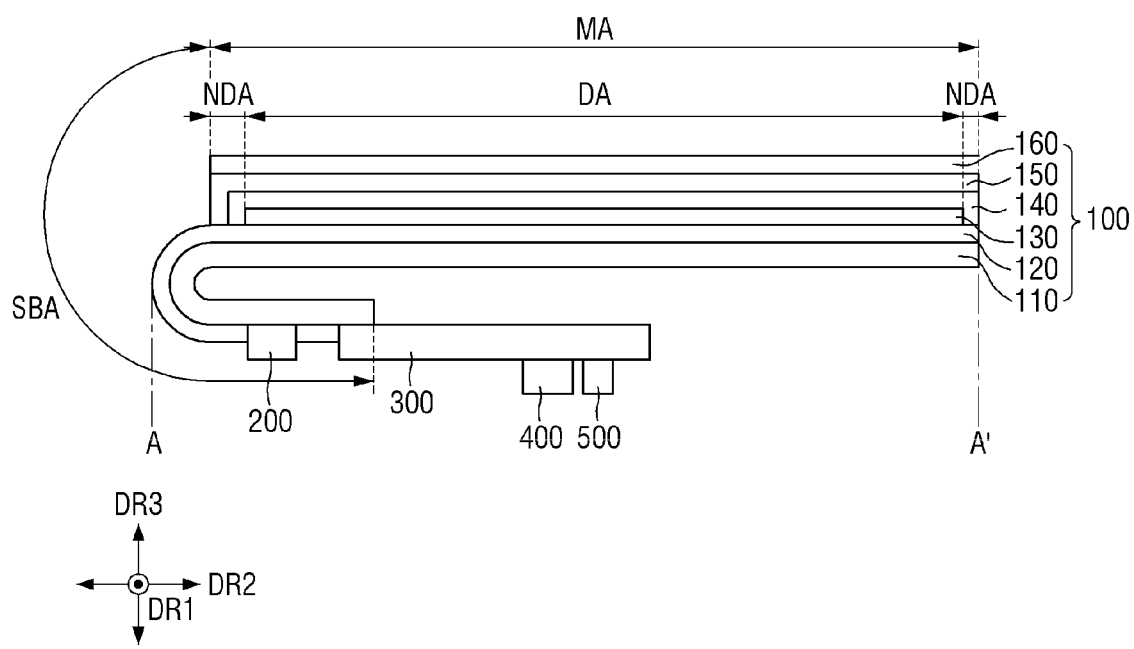
FIG. 3 is a cross-sectional view taken along line A-A' of FIG. 2.
Figure 4:
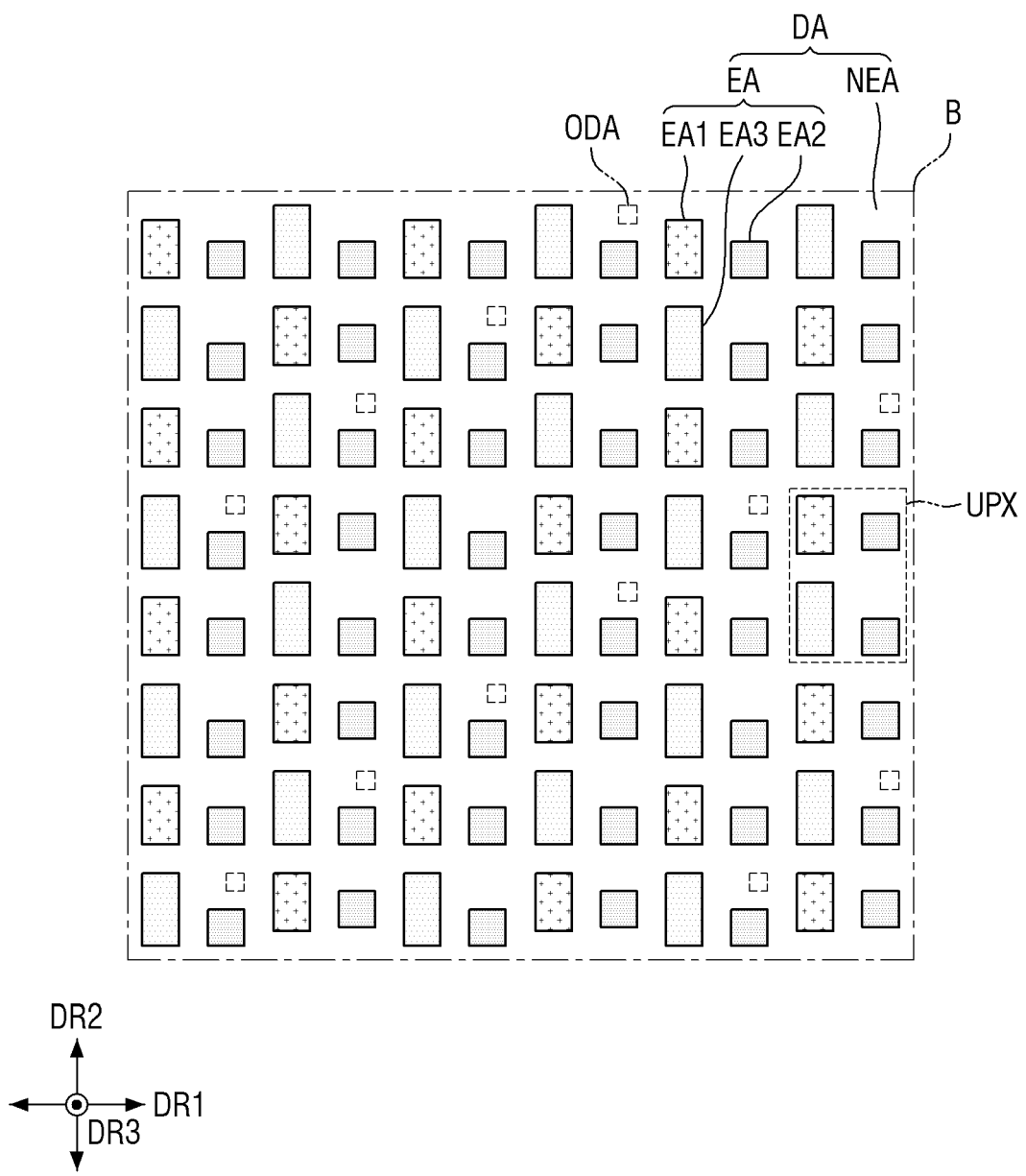
FIG. 4 is a layout diagram illustrating part B of FIG. 2.

FIG. 1 is a perspective view illustrating a display device according to embodiments. FIG. 2 is a plan view illustrating the display device of FIG. 1. FIG. 3 is a cross-sectional view taken along line A-A' of FIG. 2. FIG. 4 is a layout diagram illustrating part B of FIG. 2.

Referring to FIGS. 1 and 2, a display device 100 is a device for displaying a moving image or a still image. The display device 100 may be used as a display screen of various devices, such as a television, a laptop computer, a monitor, a billboard and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 100 may be a light emitting display device such as an organic light emitting display using an organic light emitting diode, a quantum dot light emitting display including a quantum dot light emitting layer, an inorganic light emitting display including an inorganic semiconductor, and a micro light emitting display using a micro or nano light emitting diode (LED). In the following description, it is assumed that the display device 100 is an organic light emitting display device. However, the present disclosure is not limited thereto, and may be applied to a display device including an organic insulating material, an organic light emitting material, and a metal material.

The display device 100 may be formed to be flat, but is not limited thereto. For example, the display device 100 may include a curved portion formed at left and right ends and having a constant curvature or a varying curvature. In addition, the display device 100 may be formed flexibly so that it can be curved, bent, folded, or rolled.

As illustrated in FIGS. 1, 2 and 3, the display device 100 includes a substrate 110.

The substrate 110 may include a main region MA corresponding to a display surface of the display device 100 and a sub-region SBA protruding from one side of the main region MA.

As shown in FIG. 2, the main region MA may include a display area DA disposed to occupy most of the surface including the center of the display area DA, and a non-display area NDA disposed around the display area DA.

The display area DA may, in plan view, be formed in a rectangular shape having short sides in a first direction DR1 and long sides in a second direction DR2 crossing the first direction DR1. The corner where the short side in the first direction DR1 and the long side in the second direction DR2 meet may be rounded to have a predetermined curvature or may be right-angled. The planar shape of the display area DA is not limited to the rectangular shape, and may be formed in another polygonal shape, a circular shape or an elliptical shape.

The non-display area NDA may be disposed at the edge of the main region MA to surround the display area DA.

The sub-region SBA may be a region protruding from the non-display area NDA of the main region MA to one side in the second direction DR2.

Since a part of the sub-region SBA is transformed to be bent, another part of the sub-region SBA may be disposed on the rear surface of the display device 100.

FIGS. 2 and 3 illustrate the display device 100 with a part of the sub-region SBA in a bent state.

Referring to FIG. 3, the display device 100 according to embodiments includes the substrate 110, a circuit layer 120 disposed on the substrate 110, and an element layer 130 disposed on the circuit layer 120.

The display device 100 according to embodiments may further include an encapsulation layer 140 disposed on the element layer 130, and a touch sensor layer 150 disposed on the encapsulation layer 140.

Also, the display device 100 according to embodiments may further include a polarization layer 160 disposed on the touch sensor layer 150 to reduce reflection of external light.

The substrate 110 may be formed of an insulating material such as a polymer resin. For example, the substrate 110 may be formed of polyimide. The substrate 110 may be a flexible substrate which can be bent, folded or rolled.

Alternatively, the substrate 110 may be formed of an insulating material such as glass or the like.

The substrate 110 may include a main region MA and a sub-region SBA. The main region MA may include the display area DA and the non-display area NDA.

Referring to FIG. 4, the display area DA includes emission areas EA, a non-emission area NEA which is a region between the emission areas EA, and light sensing areas ODA disposed in parts of the non-emission area NEA.

Each of the emission areas EA may be a unit that emits light in a wavelength band corresponding to one color of two or more different colors with a luminance corresponding to an image signal.

Each of the emission areas EA may have a rhombus planar shape or a rectangular planar shape. However, this is only an example, and the planar shape of the plurality of emission areas EA according to one embodiment is not limited to that illustrated in FIG. 4. That is, the plurality of emission areas EA may have a polygonal shape such as a rhombus shape or a hexagonal shape other than a rectangular shape, a circular shape, or an elliptical shape in plan view.

The emission areas EA may include a first emission area EA1 emitting light of a first color having a predetermined wavelength band, a second emission area EA2 emitting light of a second color having a wavelength band lower than that of the first color, and a third emission area EA3 emitting light of a third color having a wavelength band lower than that of the second color.

For example, the first color may be red having a wavelength band of approximately 600 nm to approximately 750 nm, the second color may be green having a wavelength band of approximately 480 nm to approximately 560 nm, and the third color may be blue having a wavelength band of approximately 370 nm to approximately 460 nm. However, this is only an example, and the wavelength bands of the first color, the second color, and the third color according to one embodiment of this specification are not limited thereto.

Since the emission areas EA include the first emission area EA1, the second emission area EA2, and the third emission area EA3, each of unit pixels PX may be provided by a combination of one or more first emission areas EA1, one or more second emission areas EA2, and one or more third emission areas EA3 adjacent to each other among the emission areas EA.

Each of the unit pixels PX may be a unit for displaying various colors including white. That is, lights of various colors displayed by the unit pixels PX may be implemented as a mixture of lights emitted from two or more emission areas EA included in each unit pixel PX.

In a case where the first color of the first emission area EA1, the second color of the second emission area EA2, and the third color of the third emission area EA3 are red, green, and blue, respectively, the third emission area EA3 may be larger than the first emission area EA1, and the second emission area EA2 may be smaller than the first emission area EA1. In the embodiment of FIG. 4, the dimension in the second direction is longest for the third emission area EA3 and the shortest for the second emission area EA2. However, this is merely an example, and the size of each of the emission areas EA is not limited to that illustrated in FIG. 4.

Further, the first emission area EA1 and the third emission area EA3 may be alternately arranged in the first direction DR1 or the second direction DR2. In addition, the second emission area EA2 may be arranged side by side in the first direction DR1 or the second direction DR2. The second emission area EA2 may be disposed between the first emission area EA1 and the third emission area EA3 in the first direction DR1 or the fifth direction DR5.

In this case, each of the unit pixels PX may include one first emission area EA1 and one third emission area EA3 adjacent to each other in the first direction DR1 or the second direction DR2, and two second emission areas EA2 adjacent thereto in the first direction DR1. However, this is only an example, and the arrangement pattern of the emission areas EA and the components of the unit pixel PX according to one embodiment are not limited to those illustrated in FIG. 4.

According to one embodiment, the display area DA includes the light sensing areas ODA disposed in parts of the non-emission area NEA.

For example, the light sensing areas ODA may be disposed between the second emission areas EA2 having a relatively small length in the second direction DR2. One or more emission areas EA may be disposed between the light sensing areas ODA in each of the first and second directions DR1 and DR2.

Referring again to FIG. 5, the element layer 130 includes light emitting elements LE (see FIG. 7) respectively disposed in the emission areas EA, and the light sensing elements PD (see FIG. 7) respectively disposed in the light sensing areas ODA.

According to embodiments, the circuit layer 120 includes light emitting pixel drivers EPD (see FIG. 6) respectively electrically connected to the light emitting elements LE of the element layer 130, light sensing pixel drivers DPD (see FIG. 6) respectively electrically connected to the light sensing elements PD of the element layer 130, data lines DL (see FIG. 6) electrically connected to the light emitting pixel drivers EPD. The circuit layer 120 may further include read-out lines ROL (see FIG. 6) that are electrically connected to the light sensing pixel drivers DPD.

The encapsulation layer 140 may cover the element layer 130 and extend into the non-display area NDA to be contact with the circuit layer 120. The encapsulation layer 140 may include a structure in which two or more inorganic layers and at least one organic layer are alternately stacked.

Referring to FIG. 3, the touch sensor layer 150 may be disposed on the encapsulation layer 140 in the main region MA. The touch sensor layer 150 may include touch electrodes for sensing a touch of a person or an object.

The polarization layer 160 blocks external light reflected from the touch sensor layer 150, the encapsulation layer 140, the element layer 130, and the circuit layer 120, and the interfaces thereof, and this is to prevent the deterioration of visibility of an image due to external light reflection.

A display driving circuit 200 may be mounted on the sub-region SBA of the substrate 110, and a display circuit board 300 may be attached thereto.

The display driving circuit 200 may be electrically connected to the data lines DL (see FIG. 6) of the circuit layer 120. The display driving circuit 200 may output a data signal based on control signals and power voltages supplied from the display circuit board 300.

The display driving circuit 200 may be provided as an integrated circuit (IC) and mounted on the sub-region SBA of the display device 100 by a chip on glass (COG) method, a chip on plastic (COP) method, or an ultrasonic method. However, this is only an example, and one embodiment is not limited thereto. For example, the display driving circuit 200 may be mounted on the display circuit board 300.

One end of the display circuit board 300 may be attached onto pads disposed on one edge of the sub-region SBA of the display device 100 by using an anisotropic conductive film.

The display circuit board 300 may be a flexible printed circuit board (FPCB) which is bendable, a rigid printed circuit board (PCB) which maintains a flat shape, or a composite printed circuit board having both of the rigid printed circuit board and the flexible printed circuit board.

A touch driving circuit 400 and a scanning driving circuit 500 may be mounted on the display circuit board 300.

The touch driving circuit 400 may be electrically connected to the touch sensor layer 150 of the display device 100.

The touch driving circuit 400 may determine whether the user has touched the display area DA or otherwise conveyed an input by applying touch driving signals to driving lines of the touch sensor layer 150 and detecting changes in capacitances based on touch sensing signals received from sensing lines. In one embodiment, a user's "touch" means that an object such as a pen or a user's finger is in direct contact with the top surface of the cover window disposed on the touch sensor layer. Besides a "touch," a user may convey an input through an "approach," which is intended to mean an object such as the pen or the user's finger hovering over the top surface of the cover window without direct contact. For simplicity, a "touch" will be used to refer to user input in this disclosure with the understanding that the inventive concept is adaptable to other types of user input. The touch driving circuit 400 may output touch data including the user's touch coordinates to a main processor.

The scanning driving circuit 500 may be electrically connected to the read-out lines ROL (see FIG. 6) of the circuit layer 120.

The scanning driving circuit 500 may periodically receive light sensing signals from the light sensing elements PD (see FIG. 7) disposed in the light sensing areas ODA (see FIG. 4) of the main region MA through the light sensing pixel drivers DPD (see FIG. 6) and the read-out lines ROL. Further, based on the collected light sensing signals, the scanning driving circuit 500 may output, to the main processor, scanning data about the shape of an object in contact with a screen by detecting differences in the amount of light reflected by the object in contact with the screen.

Figure 5:
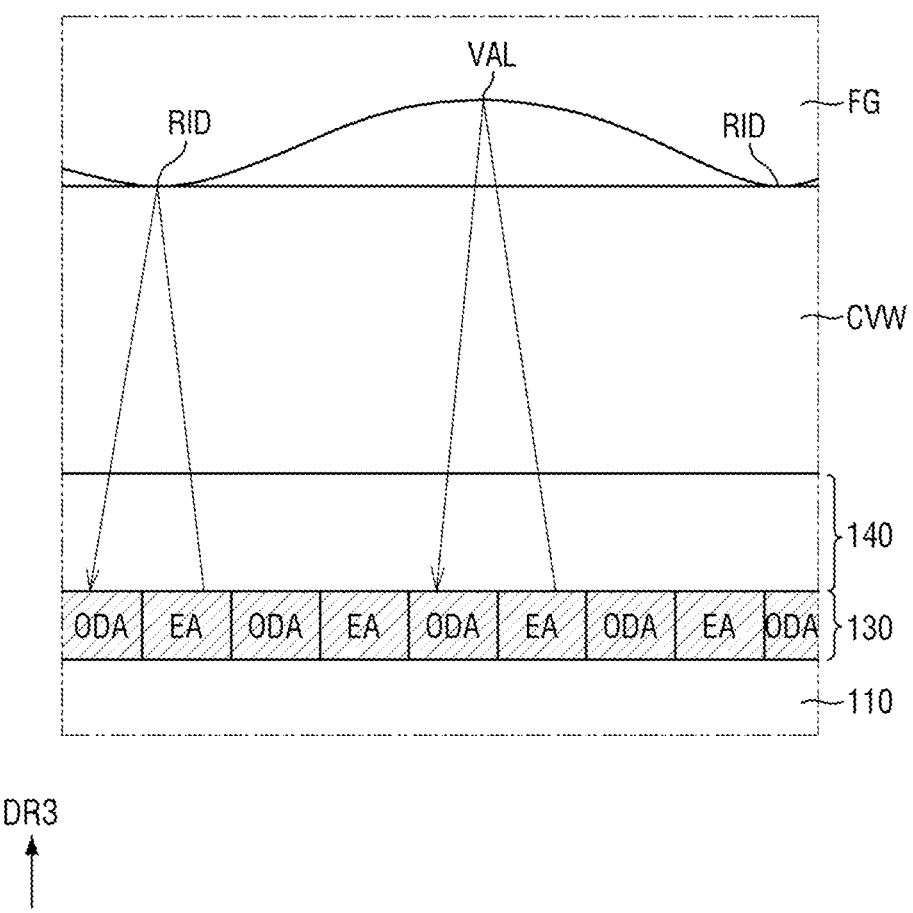
FIG. 5 is an diagram illustrating a scanning function by the light sensing areas shown in FIG. 4.

FIG. 5 is a diagram illustrating a scanning function by the light sensing areas shown in FIG. 4.

Referring to FIG. 5, the display device 100 may further include a cover window CVW disposed above the encapsulation layer 140.

For example, the cover window CVW may be attached to the polarization layer 160 (see FIG. 3) by a transparent adhesive member such as an optically clear adhesive (OCA) film or an optically clear resin (OCR).

The cover window CVW may be made of an inorganic material such as glass, or an organic material such as plastic or a polymer material.

Due to the cover window CVW, the touch sensor layer 150, the encapsulation layer 140, the element layer 130, and the circuit layer 120 may be protected from electrical and physical impact on the display surface.

The display device 100 according to embodiments may include the light sensing elements PD disposed in the light sensing areas ODA, and thus may provide a scanning function to detect the shape of an object in contact with the screen.

The fingerprint of a user's finger FG in contact with the cover window CVW includes ridges RID and valleys VAL between the ridges RID. The ridges RID in the fingerprint are in contact with the cover window CVW. However, the valleys VAL in the fingerprint are spaced apart from the cover window CVW. That is, the top surface of the cover window CVW under the valleys VAL is in contact with air.

Light emitted from the emission areas EA may be reflected by the user's finger FG in contact with the cover window CVW and detected by the light sensing elements PD of the light sensing areas ODA. However, since the refractive index of the finger FG is different from that of the air, the amount of light reflected from the ridge RID may be different from the amount of light reflected from the valley VAL.

Accordingly, based on the difference in the amount of light incident on the light sensing elements PD, the positions and shapes of the ridge RID and the valley VAL of the fingerprint FG may be determined, allowing the fingerprint FG pattern of the finger to be read.

Figure 6:
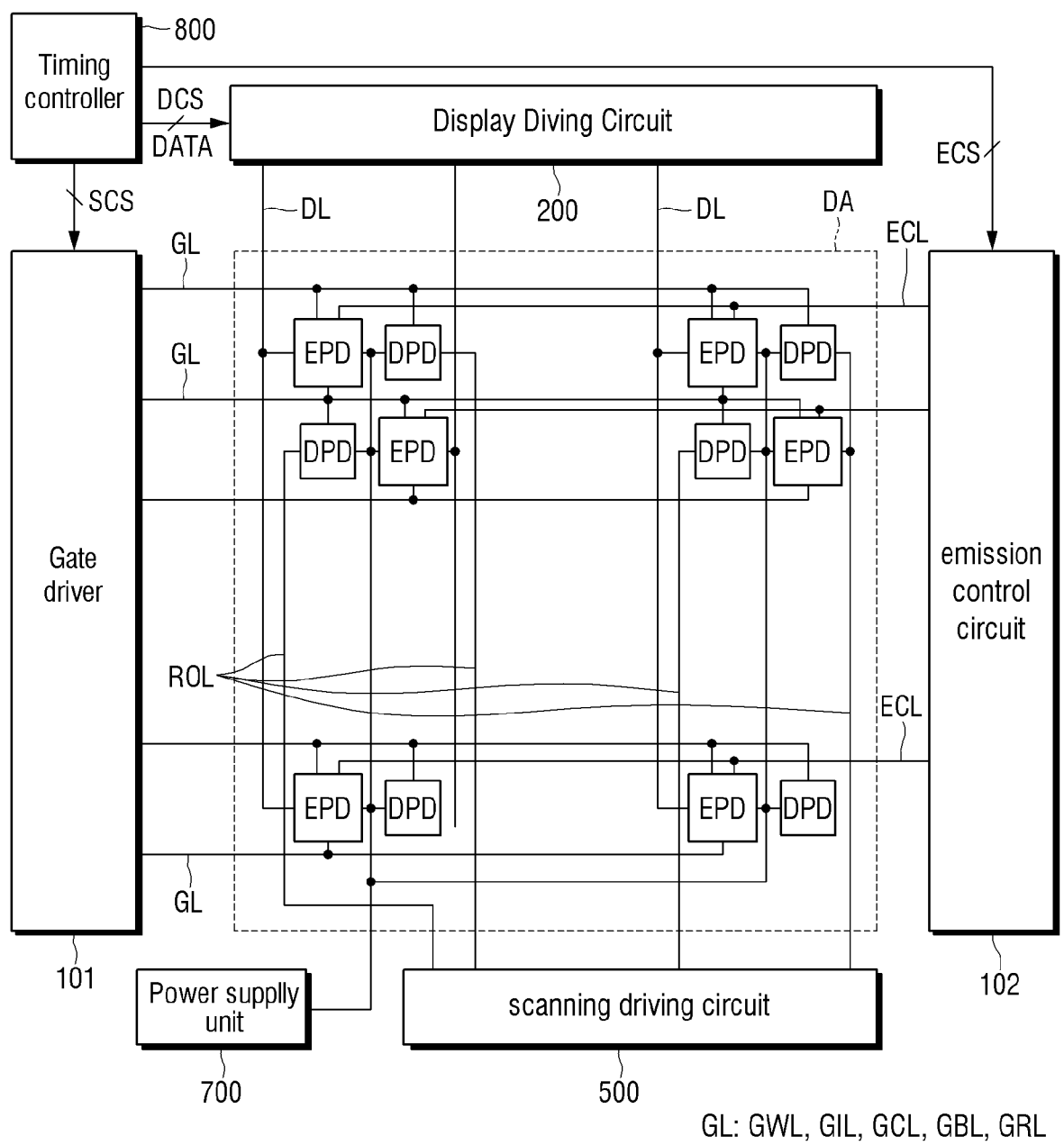
FIG. 6 is a block diagram showing a circuit layer of FIG. 3.

FIG. 6 is a block diagram showing a circuit layer of FIG. 3.

Referring to FIG. 6, the circuit layer 120 of the display device 100 according to embodiments may include the light emitting pixel drivers EPD respectively corresponding to the emission areas EA of the display area DA, the light sensing pixel drivers DPD respectively corresponding to the light sensing areas ODA of the display area DA, the data lines DL electrically connected to the light emitting pixel drivers EPD, and the read-out lines ROL electrically connected to the light sensing pixel drivers DPD.

The display device 100 according to embodiments may include the display driving circuit 200 that outputs a data signal Vdata (see FIG. 7) of each of the light emitting pixel drivers EPD, the scanning driving circuit 500 that collects a light sensing signal of the light sensing pixel drivers DPD, a gate driving circuit 101 that supplies one or more gate signals to the light emitting pixel drivers EPD and the light sensing pixel drivers DPD, an emission control circuit 102 that supplies an emission control signal EC (see FIG. 7) to the light emitting pixel drivers EPD, a power supply unit 700 that supplies various powers and voltages to the light emitting pixel drivers EPD and the light sensing pixel drivers DPD, and a timing controller 800 that controls driving timing.

The timing controller 800 receives an image signal supplied from the outside of the display device 100. The timing controller 800 may output image data DATA and a data control signal DCS to the display driving circuit 200. In addition, the timing controller 800 may generate a scan control signal SCS for controlling the operation timing of the gate driving circuit 101, and an emission control driving signal ECS for controlling the operation timing of the emission control circuit 102. For example, the timing controller 800 may generate the scan control signal SCS and the emission control driving signal ECS, output the scan control signal SCS to the gate driving circuit 101 through a scan control line, and output the emission control driving signal ECS to the emission control circuit 102 through an emission control driving line.

The display driving circuit 200 may convert the image data DATA into analog data voltages and output them to the data lines DL.

The gate driving circuit 101 may generate gate signals in response to the scan control signal SCS and sequentially output the gate signals to gate lines GL. The gate lines GL may include a scan write line GWL (see FIG. 7) for transmitting a scan write signal GW (see FIG. 7), a scan initialization line GIL (see FIG. 7) for transmitting a scan initialization signal GI (see FIG. 7), a gate control line GCL (see FIG. 7) for transmitting a gate control signal GC (see FIG. 7), a bias control line GBL (see FIG. 7) for transmitting a bias control signal GB (see FIG. 7), and a reset control line GRL (see FIG. 7) for transmitting a reset control signal GR (see FIG. 7). As depicted in FIG. 6, the reset control lines GRL are electrically connected to the light sensing pixel drivers EPDs.

The emission control circuit 102 may sequentially output the emission control signals EC (see FIG. 7) to the emission control lines ECL in response to the emission control driving signal ECS. The emission control signals EC of the emission control circuit 102 may have pulses of a first level voltage or a second level voltage. In some embodiments, the emission control circuit 102 may not be provided separately from the gate driving circuit 101 and may be incorporated into the gate driving circuit 101.

The power supply unit 700 may supply various types of power required to drive the light emitting pixel drivers EPD and the light sensing pixel drivers DPD.

For example, powers provided by the power supply unit 700 may include a first power ELVDD (see FIG. 7) and a second power ELVSS (see FIG. 7) for driving the light emitting elements LE, and a first initialization power VINT (see FIG. 7) and a second initialization power VAINT (see FIG. 7) for initializing the light emitting pixel drivers EPD.

In addition, the powers provided by the power supply unit 700 may further include a reset voltage VRST (see FIG. 7) for resetting the light sensing pixel drivers DPD.

The scanning driving circuit 500 may be electrically connected to the light sensing elements PD through the read-out lines ROL and the light sensing pixel drivers DPD.

Each of the light sensing elements PD may generate a photocurrent corresponding to the amount of light incident on the light sensing element PD, and the scanning driving circuit 500 may read a user's fingerprint based on the photocurrent of each of the light sensing elements PD.

The scanning driving circuit 500 may generate scanning data depending on the magnitude of photocurrent detected by the light sensing elements PD and transmit it to the main processor, and the main processor may compare the scanning data with reference data and execute an application based on whether the scanning data matches the user's fingerprint.

Figure 7:
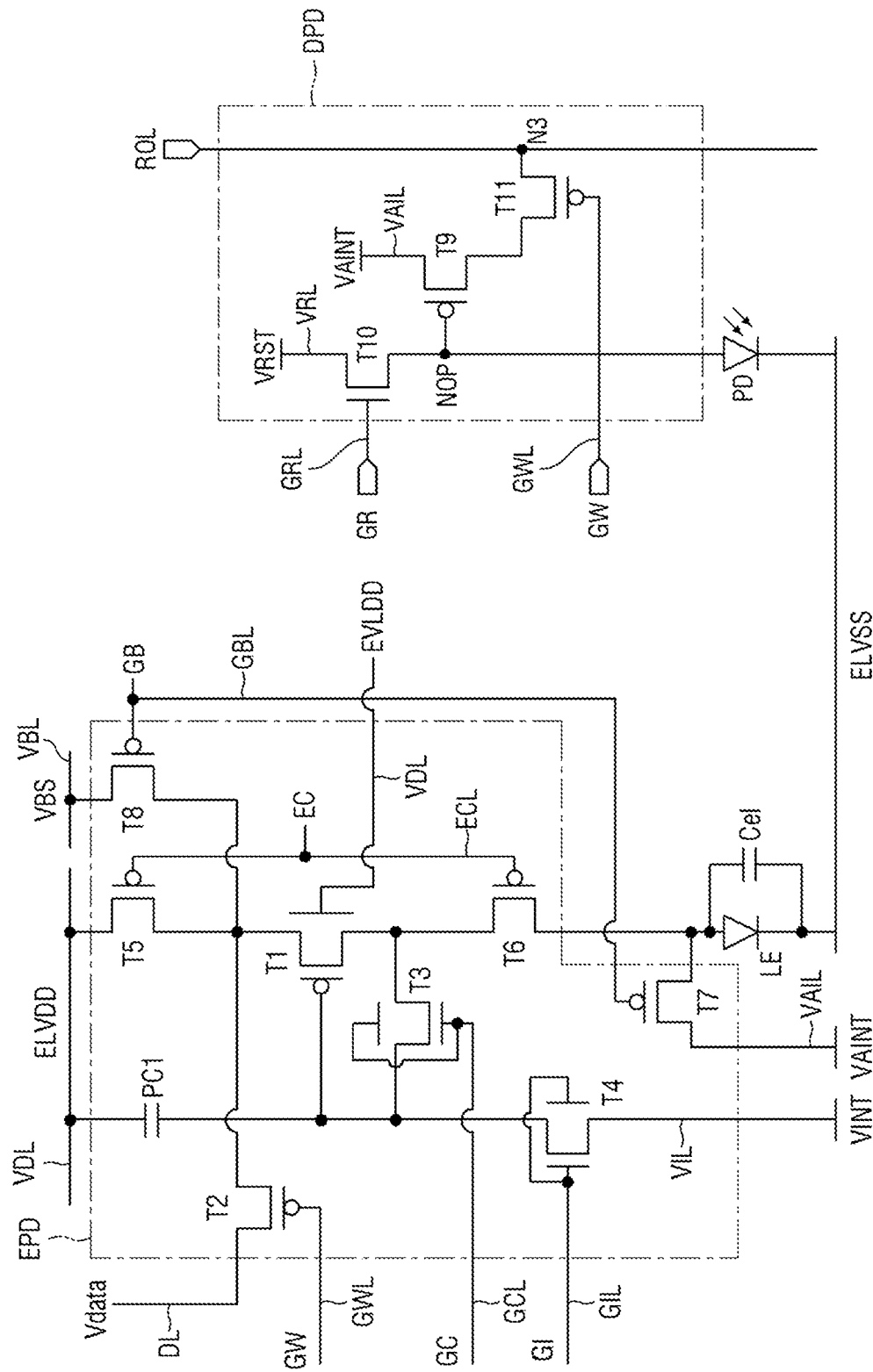
FIG. 7 is an equivalent circuit diagram of the light emitting pixel driver and the light sensing pixel driver of FIG. 6.

FIG. 7 is an equivalent circuit diagram of the light emitting pixel driver and the light sensing pixel driver of FIG. 6.

Referring to FIG. 7, one of the light emitting elements LE of the element layer 130 may be electrically connected between one of the light emitting pixel drivers EPD of the circuit layer 120 and the second power ELVSS.

An anode electrode 131 (see FIG. 8) of the light emitting element LE may be electrically connected to the light emitting pixel driver EPD, and a cathode electrode 134 (see FIG. 8) of the light emitting element LE may be applied with the second power ELVSS having a lower voltage level than the first power ELVDD.

A capacitor Cel connected in parallel with the light emitting element LE refers to a parasitic capacitance between the anode electrode 131 and the cathode electrode 134.

The circuit layer 120 may further include a first power line VDL for transmitting the first power ELVDD, a first initialization power line VIL for transmitting the first initialization power VINT, a second initialization power line VAIL for transmitting the second initialization power VAINT, and a bias power line VBL for transmitting a bias power VBS.

The circuit layer 120 may further include the scan write line GWL for transmitting the scan write signal GW, the scan initialization line GIL for transmitting the scan initialization signal GI, an emission control line ECL for transmitting the emission control signal EC, the gate control line GCL for transmitting the gate control signal GC, and the bias control line GBL for transmitting the bias control signal GB.

One light emitting pixel driver EPD of the circuit layer 120 may include a first transistor T1 configured to generate a driving current for driving the light emitting element LE, two or more transistors T2 to T8 electrically connected to the first transistor T1, and at least one capacitor PC1.

The first transistor T1 is connected in series with the light emitting element LE between the first power ELVDD and the second power ELVSS.

That is, the first electrode (e.g., the source electrode) of the first transistor T1 may be electrically connected to the first power line VDL through the fifth transistor T5. Further, the second electrode (e.g., the drain electrode) of the first transistor T1 may be electrically connected to the anode electrode 131 of the light emitting element LE through the sixth transistor T6.

The first electrode of the first transistor T1 may be electrically connected to the data line DL through the second transistor T2.

The gate electrode of the first transistor T1 may be electrically connected to the first power line VDL through the first capacitor PC1. That is, the first capacitor PC1 may be electrically connected between the gate electrode of the first transistor T1 and the first power line VDL.

Accordingly, the potential of the gate electrode of the first transistor T1 may be maintained by the first power ELVDD of the first power line VDL.

Further, when the data signal Vdata of the data line DL is transmitted to the first electrode of the first transistor T1 through the turned-on second transistor T2, the voltage difference corresponding to the data signal Vdata and the first power ELVDD may be generated between the gate electrode of the first transistor T1 and the first electrode of the first transistor T1.

In this case, when the voltage difference between the gate electrode of the first transistor T1 and the first electrode of the first transistor T1, i.e., the gate-to-source voltage difference becomes equal to or greater than a threshold voltage, the first transistor T1 may be turned on, thereby generating a drain-to-source current of the first transistor T1 corresponding to the data signal Vdata.

Then, when the fifth transistor T5 and the sixth transistor T6 are turned on, the first transistor T1 may be connected in series with the light emitting element LE between the first power line VDL and the second power line VSL. Accordingly, the drain-to-source current of the first transistor T1 corresponding to the data signal Vdata may be supplied as a driving current of the light emitting element LE.

Accordingly, the light emitting element LE may emit light having a luminance corresponding to the data signal Vdata.

The second transistor T2 may be electrically connected between the first electrode of the first transistor T1 and the data line DL. The second transistor T2 may be turned on by the scan write signal GW of the scan write line GWL.

The third transistor T3 may be electrically connected between the gate electrode of the first transistor T1 and the second electrode of the first transistor T1. The third transistor T3 may be turned on by the gate control signal GC of the gate control line GCL.

The fourth transistor T4 may be connected between the gate electrode of the first transistor T1 and the first initialization power line VIL. The fourth transistor T4 may be turned on by the scan initialization signal GI of the scan initialization line GIL.

The third transistor T3 and the fourth transistor T4 may be provided as N-type MOSFETs.

The fifth transistor T5 may be electrically connected between the first electrode of the first transistor T1 and the first power line VDL.

The sixth transistor T6 may be electrically connected between the second electrode of the first transistor T1 and the anode electrode 131 of the light emitting element LE.

The fifth transistor T5 and the sixth transistor T6 may be turned on by the emission control signal EC of the emission control line ECL.

The seventh transistor T7 may be electrically connected between the anode electrode of the light emitting element LE and the second initialization power line VAIL. The seventh transistor T7 may be turned on by the bias control signal GB of the bias control line GBL.

The eighth transistor T8 may be connected between the first electrode of the first transistor T1 and the bias power line VBL.

The eighth transistor T8 may be turned on by the bias control signal GB of the bias control line GBL.

Among the first to eighth transistors T1 to T8, the transistors T1, T2, and T5 to T8 other than the third and fourth transistor T3 and T4 may be provided as P-type MOSFETs.

In addition, one of the light sensing elements PD of the element layer 130 may be electrically connected between an element output node NOP of one of the light sensing pixel drivers DPD of the circuit layer 120 and the second power ELVSS.

The circuit layer 120 may further include the reset control line GRL for transmitting the reset control signal GR for initiating a reset of the light sensing pixel drivers DPD, a reset voltage line VRL for transmitting the reset voltage VRST for resetting the light sensing pixel drivers DPD, and the read-out line ROL electrically connecting the light sensing pixel drivers DPD to the scanning driving circuit 500.

Each of the light sensing pixel drivers DPD may include at least one transistor T9, T10, T11.

The light sensing element PD may be a photoelectric conversion element that converts incident light into an electrical signal by generating a photocurrent corresponding to the amount of the incident light, and outputs a light sensing signal.

The light sensing element PD may be a photodiode including a sensing anode electrode, a sensing cathode electrode, and a photoelectric conversion layer disposed between the sensing anode electrode and the sensing cathode electrode.

The light sensing element PD may be a phototransistor or an inorganic photodiode formed of a pn type or pin type inorganic material. Alternatively, the photoelectric conversion element PD may also be an organic photodiode including an electron donating material generating donor ions and an electron accepting material generating acceptor ions.

When light is incident on the light sensing element PD, the photoelectric conversion layer may react to the incident light to generate photocharges, and the photocharges generated in the photoelectric conversion layer may move, thereby generating a photocurrent between the sensing anode electrode and the sensing cathode electrode.

As one example, photocharges generated in the photoelectric conversion layer by light incident on the light sensing element PD may be accumulated in the sensing anode electrode. In addition, the potential of the element output node NOP electrically connected to the sensing anode electrode may be increased by the photocharges accumulated in the sensing anode electrode. When the light sensing element PD and the read-out line ROL are connected to the element output node NOP by the turn-on of ninth and eleventh transistors T9 and T11, a sensing voltage may be accumulated at a third node N3 between the read-out line ROL and the eleventh sensing transistor T11 in proportion to the voltage at the element output node NOP where charges are accumulated.

The ninth transistor T9 may include a gate electrode electrically connected to the element output node NOP, and may be electrically connected between the second initialization power line VAIL and the eleventh transistor T11.

The ninth transistor T9 may be a source follower amplifier that generates a source-drain current in proportion to the amount of electric charges of the element output node NOP inputted to the gate electrode thereof.

When the potential of the element output node NOP is increased by the photocharges accumulated in the light sensing element PD, and the difference voltage between the second initialization power VAINT and the potential of the element output node NOP becomes equal to or greater than the threshold voltage of the ninth transistor T9, the ninth transistor T9 may be turned on. In this case, a light sensing signal corresponding to the difference voltage between the second initialization power VAINT and the potential of the element output node NOP may be generated by the turned-on ninth transistor T9.

Although FIG. 7 illustrates that the first electrode of the ninth transistor T9 is connected to the second initialization power line VAIL, embodiments are not limited to the illustration of FIG. 7. That is, the first electrode of the ninth transistor T9 may be connected to one of the first power line VDL and the first initialization power line VIL, rather than the second initialization power line VAIL.

The tenth transistor T10 may be electrically connected between the element output node NOP and the reset voltage line VRL, and may be turned on by the reset control signal GR of the reset control line GRL. Accordingly, when the tenth transistor T10 is turned on by the reset control signal GR, the potential of the element output node NOP may be reset to the reset voltage VRST of the reset voltage line VRL.

The eleventh transistor T11 may be electrically connected between the second electrode of the ninth transistor T9 and the read-out line ROL, and may be turned on by the scan write signal GW of the scan write line GWL. Accordingly, the source-drain current, i.e., the light sensing signal, of the ninth transistor T9 may be transmitted to the read-out line ROL through the eleventh transistor T11 turned on by the scan write signal GW.

The ninth transistor T9 and the eleventh transistor T11 may be provided as P-type MOSFETs, and the tenth transistor T10 may be provided as an N-type MOSFET.

Figure 8:
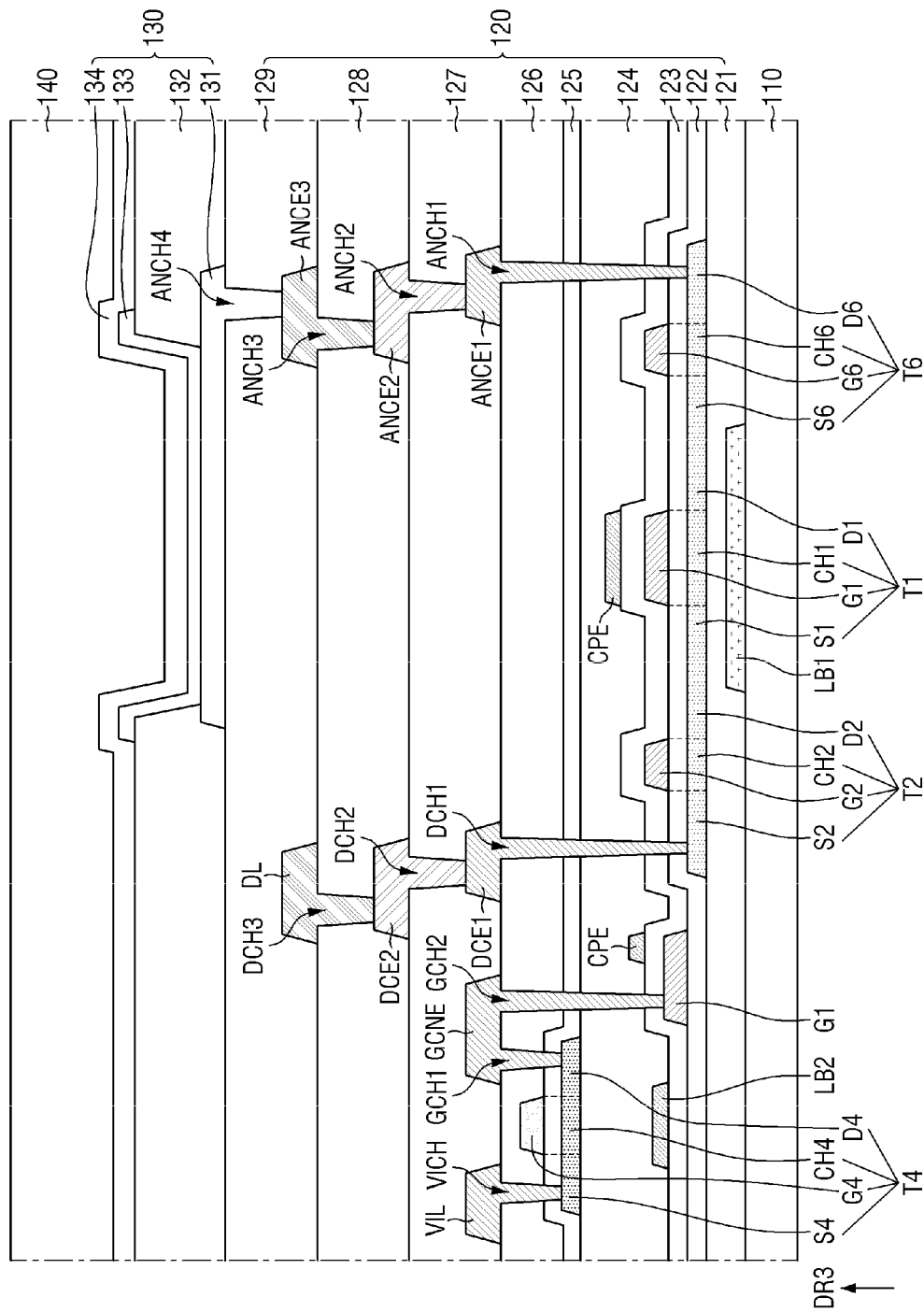
FIG. 8 is a cross-sectional view illustrating one light emitting element, the first transistor, the second transistor, the fourth transistor, and the sixth transistor of FIG. 7.

FIG. 8 is a cross-sectional view illustrating one light emitting element, the first transistor, the second transistor, the fourth transistor, and the sixth transistor of FIG. 7.

Referring to FIG. 8, the circuit layer 120 may include a buffer layer 121 covering a first light blocking layer LB1 on the substrate 110; a first semiconductor layer CH1, S1, D1, CH2, S2, D2, CH6, S6, and D6 disposed on the buffer layer 121; a first gate insulating layer 122 covering the first semiconductor layer CH1, S1, D1, CH2, S2, D2, CH6, S6, and D6; a first gate conductive layer G1, G2, and G6 disposed on the first gate insulating layer 122; a second gate insulating layer 123 covering the first gate conductive layer G1, G2, and G6; a second gate conductive layer CPE and LB2 disposed on the second gate insulating layer 123; a first interlayer insulating layer 124 covering the second gate conductive layer CPE and LB2; a second semiconductor layer CH4, S4, and D4 disposed on the first interlayer insulating layer 124; a third gate insulating layer 125 covering the second semiconductor layers CH4, S4, and D4; a third gate conductive layer G4 disposed on the third gate insulating layer 125; a second interlayer insulating layer 126 covering the third gate conductive layer G4; a first source-drain conductive layer ANCE1, DCE1, GCNE, and VIL disposed on the second interlayer insulating layer 126; a first planarization layer 127 covering the first source-drain conductive layer ANCE1, DCE1, GCNE, and VIL; a second source-drain conductive layer ANCE2 and DCE2 disposed on the first planarization layer 127; a second planarization layer 128 covering the second source-drain conductive layer ANCE2 and DCE2; and a third source-drain conductive layer ANCE3 and DL disposed on the second planarization layer 128.

The first transistor T1 may include the channel portion CH1, the source portion S1, and the drain portion D1 formed of the first semiconductor layer on the buffer layer 121, and the gate electrode G1 disposed on the first gate insulating layer 122 and overlapping the channel portion CH1.

The channel portion CH1 of the first transistor T1 may overlap the first light blocking layer LB1 on the substrate 110.

The second transistor T2 may include the channel portion CH2, the source portion S2, and the drain portion D2 formed of the first semiconductor layer on the buffer layer 121, and the gate electrode G2 disposed on the first gate insulating layer 122 and overlapping the channel portion CH2.

The sixth transistor T6 may include the channel portion CH6, the source portion S6, and the drain portion D6 formed of the first semiconductor layer on the buffer layer 121, and the gate electrode G6 disposed on the first gate insulating layer 122 and overlapping the channel portion CH6.

The source portion S2 of the second transistor T2 may be electrically connected to the data line DL through a first data connection electrode DCE1 and a second data connection electrode DCE2.

The first data connection electrode DCE1 may be disposed on the second interlayer insulating layer 126, and may be electrically connected to the source portion S2 of the second transistor T2 through a first data connection hole DCH1 extending through the second interlayer insulating layer 126, the third gate insulating layer 125, the first interlayer insulating layer 124, the second gate insulating layer 123, and the first gate insulating layer 122.

The second data connection electrode DCE2 may be disposed on the first planarization layer 127, and may be electrically connected to the first data connection electrode DCE1 through a second data connection hole DCH2 extending through the first planarization layer 127.

The data line DL may be disposed on the second planarization layer 128, and may be electrically connected to the second data connection electrode DCE2 through a third data connection hole DCH3 extending through the second planarization layer 128.

The drain portion D2 of the second transistor T2 may be connected to the source portion S1 of the first transistor T1.

The drain portion D1 of the first transistor T1 may be connected to the source portion S6 of the sixth transistor T6.

The drain portion D6 of the sixth transistor T6 may be electrically connected to the anode electrode 131 through a first anode connection electrode ANCE1, a second anode connection electrode ANCE2, and a third anode connection electrode ANCE3.

The first anode connection electrode ANCE1 may be disposed on the second interlayer insulating layer 126, and may be electrically connected to the drain portion D6 of the sixth transistor T6 through a first anode connection hole ANCH1 extending through the second interlayer insulating layer 126, the third gate insulating layer 125, the first interlayer insulating layer 124, the second gate insulating layer 123, and the first gate insulating layer 122.

The second anode connection electrode ANCE2 may be disposed on the first planarization layer 127, and may be electrically connected to the first anode connection electrode ANCE1 through a second anode connection hole ANCH2 extending through the first planarization layer 127.

The third anode connection electrode ANCE3 may be disposed on the second planarization layer 128, and may be electrically connected to the second anode connection electrode ANCE2 through a third anode connection hole ANCH3 extending through the second planarization layer 128.

The anode electrode 131 may be disposed on a third planarization layer 129, and may be electrically connected to the third anode connection electrode ANCE3 through a fourth anode connection hole ANCH4 extending through the third planarization layer 129.

The first capacitor PC1 may be provided by an overlapping region between a capacitor electrode CPE disposed on the second gate insulating layer 123 and the gate electrode G1 of the first transistor T1.

The fourth transistor T4 may include a channel portion CH4, a source portion S4, and a drain portion D4 formed of the second semiconductor layer on the first interlayer insulating layer 124, and a gate electrode G4 disposed on the third gate insulating layer 125 and overlapping the channel portion CH4.

The channel portion CH4 of the fourth transistor T4 may overlap a second light blocking layer LB2 on the second gate insulating layer 123.

The source portion S4 of the fourth transistor T4 may be electrically connected to the first initialization power line VIL on the second interlayer insulating layer 126 through a hole extending through the second interlayer insulating layer 126 and the third gate insulating layer 125.

The drain portion D4 of the fourth transistor T4 may be electrically connected to the gate electrode G1 of the first transistor T1 through a gate connection electrode GCNE on the second interlayer insulating layer 126.

The gate connection electrode GCNE may be electrically connected to the drain portion D4 of the fourth transistor T4 through a first gate connection hole GCH1 extending through the second interlayer insulating layer 126 and the third gate insulating layer 125.

The gate connection electrode GCNE may be electrically connected to the gate electrode G1 of the first transistor T1 through a second gate connection hole GCH2 extending through the second interlayer insulating layer 126, the third gate insulating layer 125, the first interlayer insulating layer 124, and the second gate insulating layer 123.

The third transistor T3 and the tenth transistor T10 are similar in structure to the fourth transistor T4, and the fifth transistor T5, the seventh transistor T7; and the ninth transistor T9 and the eleventh transistor T11 are similar in structure to the second transistor T2 and the sixth transistor T6. Hence, redundant description of the transistor structures is omitted below.

To reduce the width of the non-display area NDA, the display device 100 according to embodiments may include a transmission bypass line electrically connected between some of the data lines DL adjacent to the non-display area NDA and the display driving circuit 200 and disposed in the display area DA.

Figure 9:
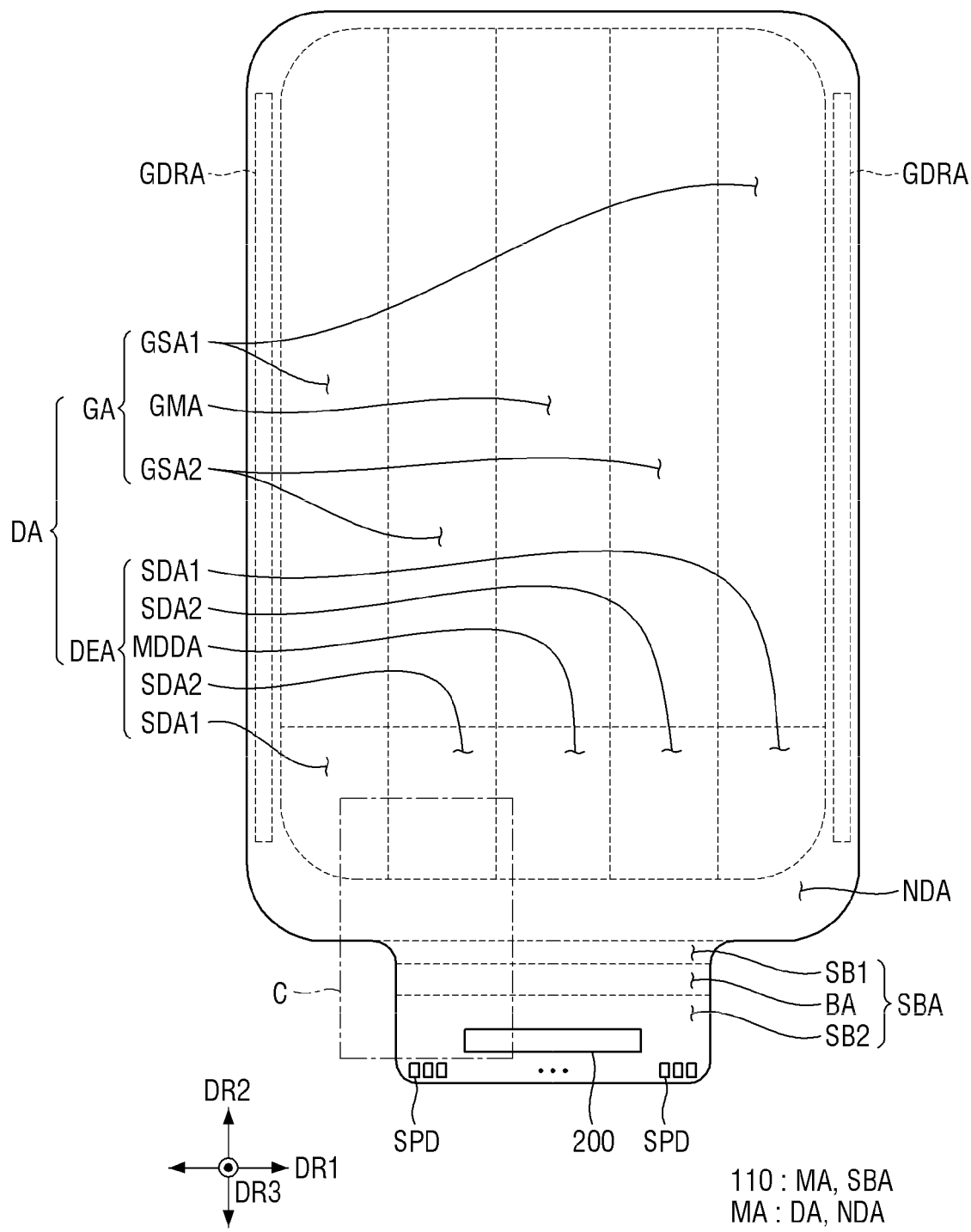
FIG. 9 is a plan view illustrating a main region and a sub-region of the substrate of FIG. 2.

FIG. 9 is a plan view illustrating a main region and a sub-region of the substrate of FIG. 2.

Referring to FIG. 9, the substrate 110 of the display device 100 includes the main region MA corresponding to the display surface, and the sub-region SBA protruding from one side of the main region MA.

The main region MA may include the display area DA disposed at the center area of the polygonal shape and most of the area except for the area close to the periphery, and the non-display area NDA disposed at the periphery to surround the display area DA.

The display area DA may include a bypass area DEA disposed on one side adjacent to the sub-region SBA, and a general area GA disposed in the remaining area excluding the bypass area DEA.

The bypass area DEA includes a bypass middle area MDDA disposed at the center of an imaginary line extending across the display area DA in the first direction DR1, a first bypass side area SDA1 parallel to the bypass middle area MDDA in the first direction DR1 and in contact with the non-display area NDA, and a second bypass side area SDA2 disposed between the bypass middle area MDDA and the first bypass side area SDA1.

The first bypass side area SDA1 may be disposed adjacent to the bent corner of the substrate 110 unlike the bypass middle area MDDA and the second bypass side area SDA2.

The first bypass side area SDA1 and the second bypass side area SDA2 may be disposed between the bypass middle area MDDA and the non-display area NDA on both sides of the bypass middle area MDDA in the first direction DR1.

The general area GA may include a general middle area GMA connected to the bypass middle area MDDA of the bypass area DEA in the second direction DR2, a first general side area GSA1 connected to the first side area SDA1 of the bypass area DEA in the second direction DR2, and a second general side area GSA2 connected to the second side area SDA2 of the bypass area DEA in the second direction DR2.

The non-display area NDA may include a gate driving circuit area GDRA in which the gate driving circuit 101 and the emission control circuit 102 are disposed.

The gate driving circuit area GDRA may be disposed in a portion of the non-display area NDA adjacent to at least one side of the display area DA in the first direction DR1.

The sub-region SBA may include a bending region BA that is bendable, a first sub-region SB1 disposed between one side of the bending region BA and the main region MA, and a second sub-region SB2 adjacent to the other side of the bending region BA. The second sub-region SB2 may be adjacent to a side of the bending region BA that is on the opposite side of the side that is adjacent to the first sub-region SB1.

When the bending region BA is transformed into a bending shape as depicted in FIG. 3, the second sub-region SB2 is disposed below the substrate 110 and overlaps the main region MA.

The display driving circuit 200 may be disposed in the second sub-region SB2.

The signal pads SPD bonded to the circuit board 300 may be disposed at one edge of the second sub-region SB2.

Figure 10:
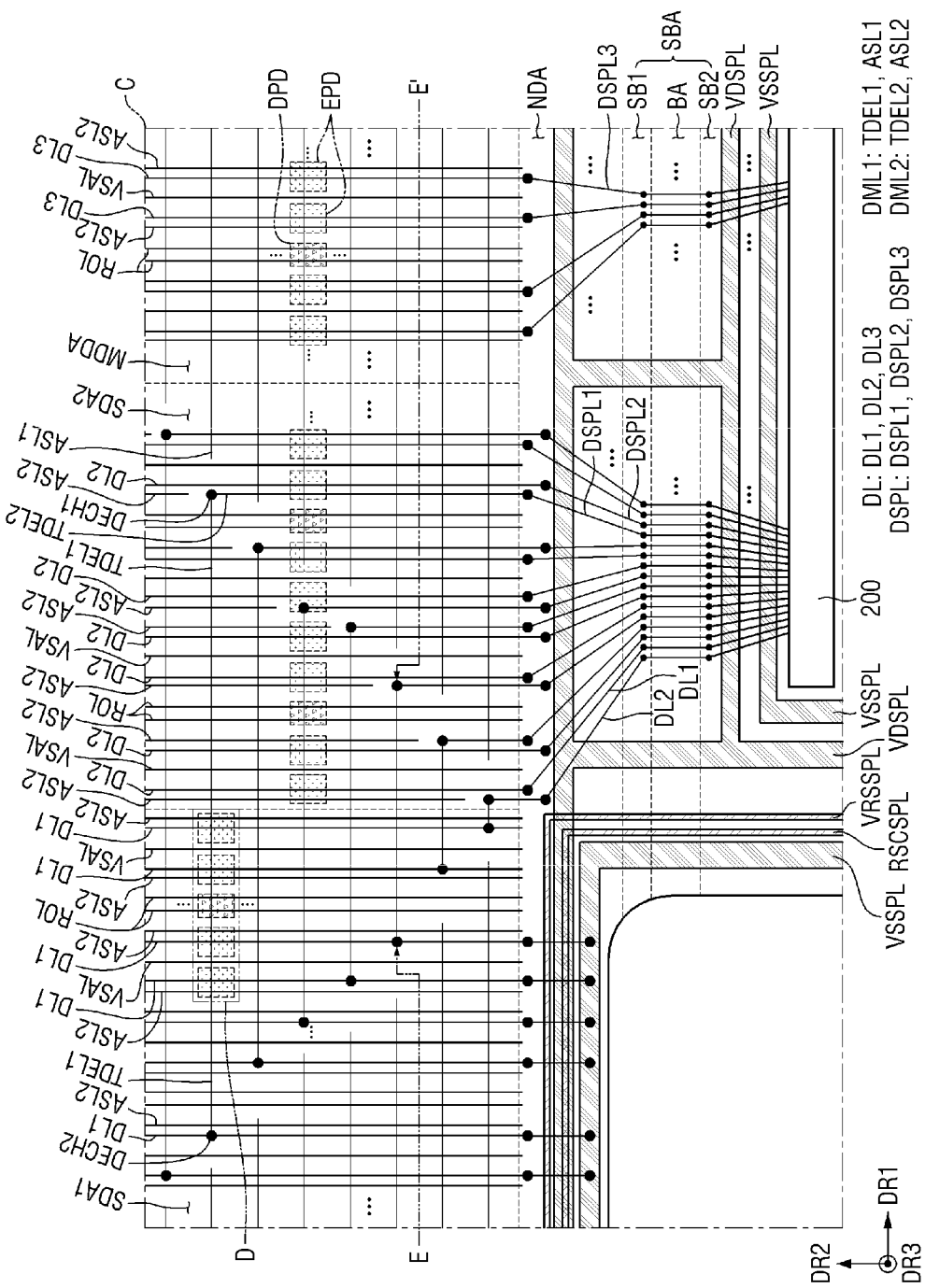
FIG. 10 is a layout diagram illustrating part C of FIG. 9.

FIG. 10 is a layout diagram illustrating part C of FIG. 9.

Referring to FIG. 10, the circuit layer 120 of the display device 100 according to embodiments includes the light emitting pixel drivers EPD electrically connected to the light emitting elements LE of the element layer 130, respectively, light sensing pixel drivers DPD electrically connected to light sensing elements PD of the element layer 130, respectively, the data lines DL electrically connected to the light emitting pixel drivers EPD and transmitting the data signal Vdata, first dummy lines DML1 extending in the first direction DR1 crossing the data lines DL, second dummy lines ASL2 extending parallel to the data lines DL and paired with the data lines DL, respectively.

The data lines DL and the second dummy lines DML2 may extend in the second direction DR2.

According to embodiments, the circuit layer 120 may further include data supply line DSPL disposed in the non-display area NDA and electrically connected to the display driving circuit 200 and the data lines DL.

The data lines DL may include a first data line DL1 disposed in the first bypass side area SDA1 and a second data line DL2 disposed in the second bypass side area SDA2.

The first dummy lines DML1 may include a first transmission bypass line TDEL1 electrically connected to the first data line DL1 of the first bypass side area SDA1.

The second dummy lines DML2 may include a second transmission bypass line TDEL2 paired with the second data line DL2 of the second bypass side area SDA2 and electrically connected to the first transmission bypass line TDEL1.

The data supply lines DSPL may include a first data supply line DSPL1 that transmits the data signal of the first data line DL1, and a second data supply line DSPL2 that transmits the data signal of the second data line DL2.

The first data supply line DSPL1 may be electrically connected to the second transmission bypass line TDEL2.

The first transmission bypass line TDEL1 may be electrically connected to the second transmission bypass line TDEL2 through a first bypass connection hole DECH1, and may be electrically connected to the first data line DL1 through a second bypass connection hole DECH2.

As stated above, according to embodiments, the first data line DL1 of the first bypass side area SDA1 may be electrically connected to the first data supply line DSPL1 extending to the second bypass side area SDA2 through the first transmission bypass line TDEL1 and the second transmission bypass line TDEL2 disposed in the bypass area DEA of the display area DA.

On the other hand, the second data supply line DSPL2 may extend to the second bypass side area SDA2, and may be electrically connected to the second data line DL2 directly.

In other words, even if the first data supply line DSPL1 extends only to the second bypass side area SDA2 relatively adjacent to the sub-region SBA, like the second data supply line DSPL2, electrical connection between the first data supply line DL1 and the first data supply line DSPL1 may be achieved through the first transmission bypass line TDEL1 and the second transmission bypass line TDEL2.

Therefore, since the first data supply line DSPL1 does not extend relatively long from the sub-region SBA to the first bypass side area SDA1 adjacent to the bent edge of the substrate 110, and the first data supply line DSPL1 is not disposed at a portion of the non-display area NDA between the bent edge of the substrate 110 and the first bypass side area SDA1, the width of the non-display area NDA may be reduced.

The data lines DL may further include a third data line DL3 disposed in the bypass middle area MDDA. In addition, the data supply lines DSPL may further include a third data supply line DSPL3 that transmits the data signal of the third data line DL3.

The third data supply line DSPL3 may extend to the bypass middle area MDDA, and may be electrically connected to the third data line DL3 directly.

The first transmission bypass line TDEL1 extends from the second transmission bypass line TDEL2 to the first data line DL1.

The second transmission bypass line TDEL2 extends from the first data supply line DSPL1 of the non-display area NDA to the first transmission bypass line TDEL1.

In this way, as the first transmission bypass line TDEL1 and the second transmission bypass line TDEL2 are limitedly arranged in the bypass area DEA, the ends of the first transmission bypass line TDEL1 and the ends of the second transmission bypass line TDEL2 are arranged with regularity. Accordingly, visibility of the first transmission bypass line TDEL1 and the second transmission bypass line TDEL2 may be increased.

To prevent this, the first dummy lines DML1 may further include first auxiliary lines ASL1 as well as the first transmission bypass line TDEL1.

In addition, the second dummy lines DML2 may further include the second auxiliary line ASL2 as well as the second transmission bypass line TDEL2.

Two of the first auxiliary lines ASL1 may extend to the non-display area NDA at both ends of the first transmission bypass line TDEL1.

One of the second auxiliary lines ASL2 may extend from one end of the second transmission bypass line TDEL2 to the non-display area NDA in a direction away from the sub-region SBA.

Accordingly, a part of the second data line DL2 may be paired with the second transmission bypass line TDEL2, and the other part thereof may be paired with the one second auxiliary line ASL2 extending from the one end of the second transmission bypass line TDEL2.

Since the second transmission bypass line TDEL2 is disposed only in the second bypass side area SDA2, the first data line DL1 of the first bypass side area SDA1 may be paired with the second auxiliary line ASL2 as a whole.

In addition, the third data line DL3 of the bypass middle area MDDA may be paired with the second auxiliary line ASL2 as a whole.

The circuit layer 120 may further include a first power supply line VDSPL and a second power supply line VSSPL that respectively transmit the first power ELVDD and the second power ELVSS for driving the light emitting elements LE.

The first power supply line VDSPL and the second power supply line VSSPL may be disposed in the non-display area NDA and may extend to the sub-region SBA.

The first power supply line VDSPL may be electrically connected to a first power pad for transmitting the first power ELVDD among the signal pads SPD disposed in the second sub-region SB2.

The second power supply line VSSPL may be electrically connected to a second power pad for transmitting the second power ELVSS among the signal pads SPD disposed in the second sub-region SB2.

The first auxiliary lines ASL1 may be electrically connected to the second power supply line VSSPL.

The second auxiliary lines ASL2 may be electrically connected to the first auxiliary lines ASL1 and the second power supply line VSSPL.

According to embodiments, the circuit layer 120 may further include a second power auxiliary line VSAL disposed in the same layer as the data lines DL and the second dummy lines DML2 and electrically connected to the second power supply line VSSPL.

According to embodiments, the display device 100 may have a scanning function for detecting the curvature of an object in contact with a screen based on a difference in the amount of light reflected from the screen.

To this end, the display device 100 may further include light sensing elements PD distributed in at least a part of the display area DA, and a scanning driving circuit 500 that periodically collects light sensing signals of the light sensing elements.

The light sensing elements PD may be disposed in light sensing areas ODA that are parts of the non-emission area NEA.

The circuit layer 120 of the display device 100 according to embodiments further includes the light sensing pixel drivers DPD electrically connected to the light sensing elements, respectively, and the reset control line GRL that transmits the reset control signal GR for resetting the light sensing pixel drivers DPD.

In addition, the circuit layer 120 may further include the reset voltage line VRL that transmits the reset voltage VRST to the light sensing pixel drivers DPD, and read-out lines ROL that are electrically connected between the light sensing pixel drivers DPD and the scanning driving circuit 500.

The reset control line GRL may extend in the first direction DR1, like the first dummy lines DML1.

The read-out lines ROL may extend in the second direction DR2, parallel to the data lines DL.

Figure 11:
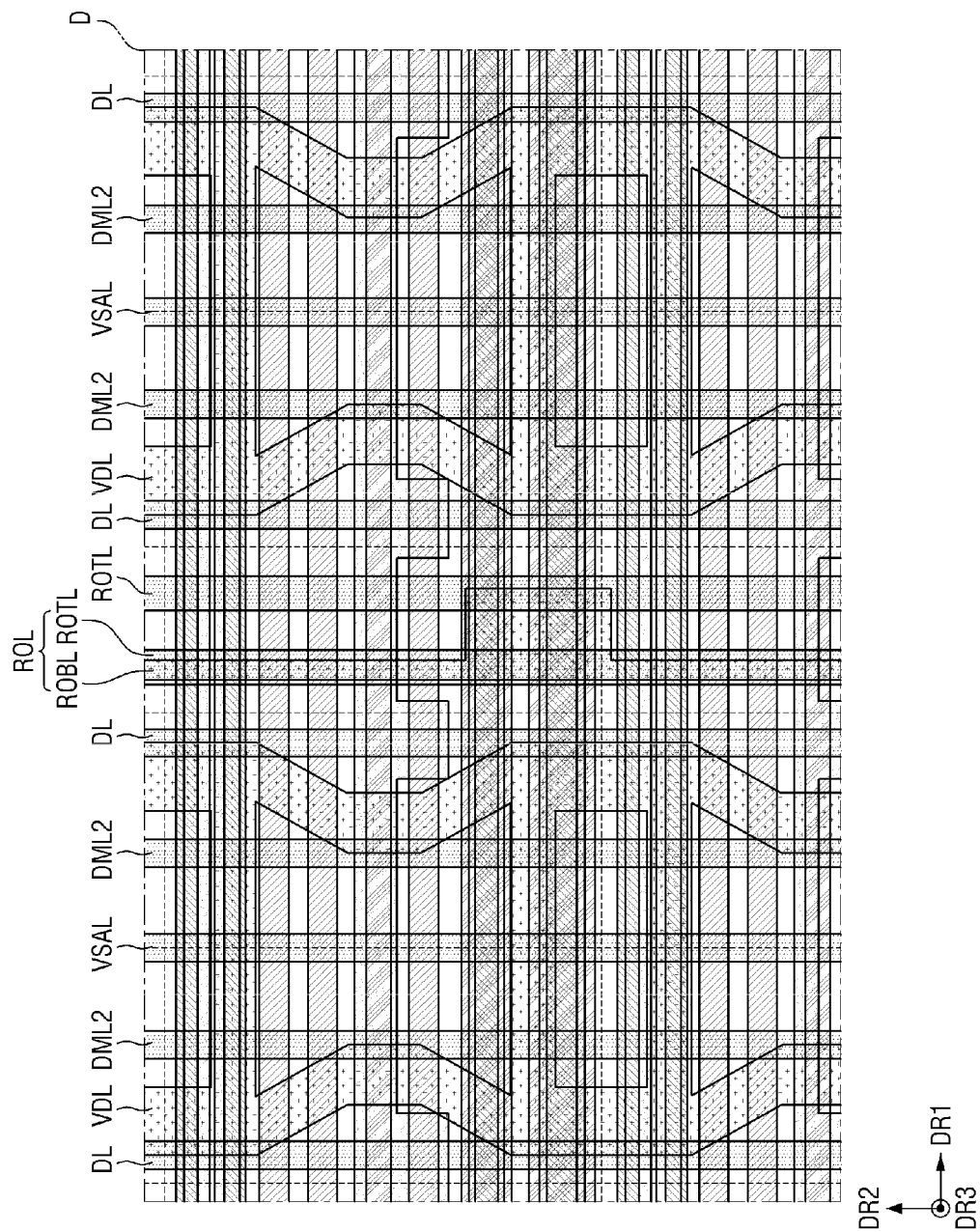
FIG. 11 is a layout view illustrating lines disposed in part D of FIG. 10.
Figure 12:
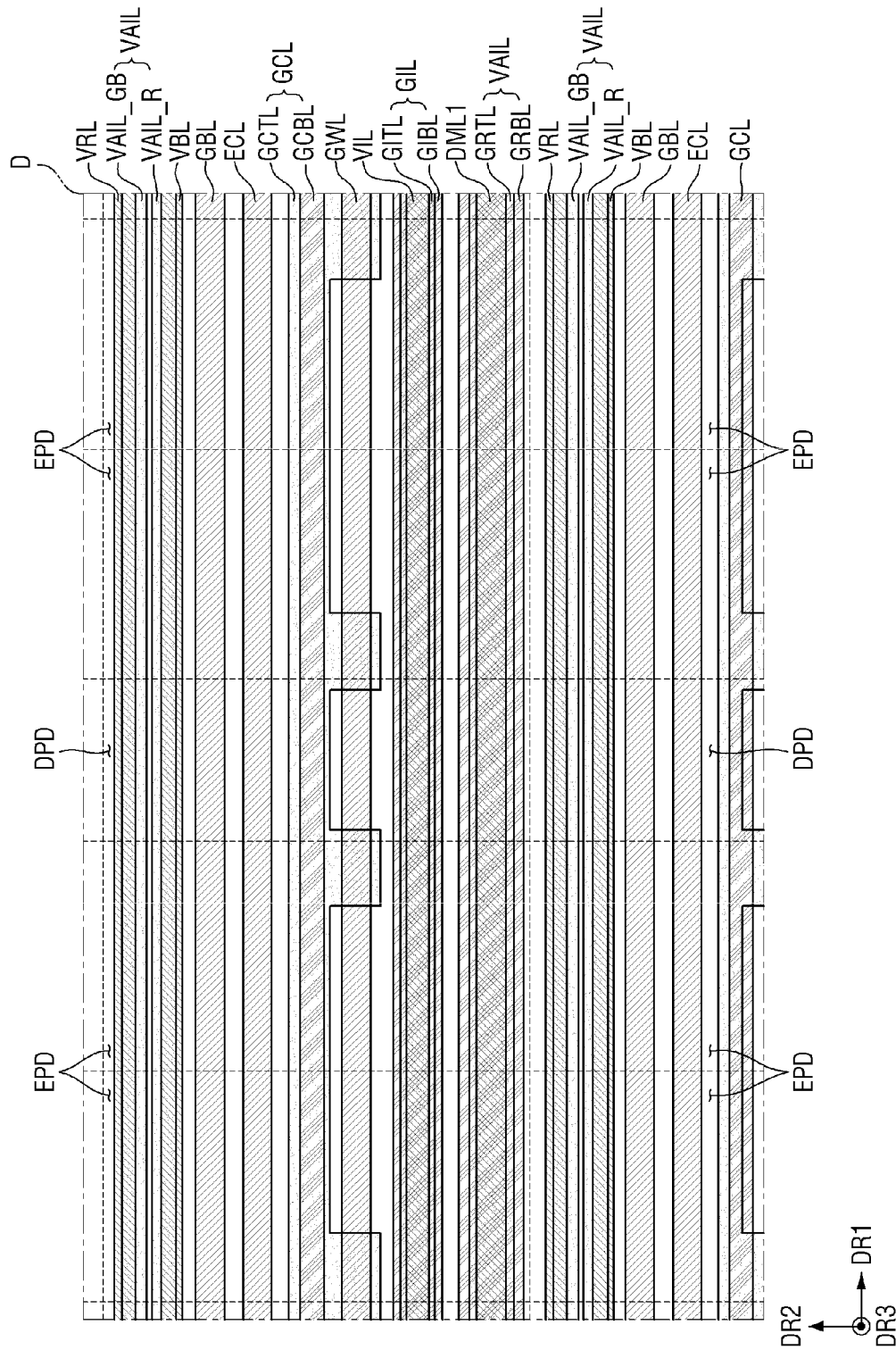
FIG. 12 is a layout view illustrating lines extending in the first direction in FIG. 11.

FIG. 11 is a layout view illustrating lines disposed in part D of FIG. 10. FIG. 12 is a layout view illustrating lines extending in the first direction in FIG. 11.

Referring to FIG. 11, the data lines DL in the circuit layer 120 of the display device 100 according to embodiments may extend in the second direction DR2.

The second dummy lines DML2 respectively paired with the data lines DL may extend in the second direction DR2 parallel to the data lines DL.

Further, the read-out line ROL, the second power auxiliary line VSAL, and the first power line VDL may also extend in the second direction DR2.

The data lines DL, the second dummy lines DML2, and the second power auxiliary line VSAL may be disposed on the same layer. That is, the data lines DL, the second dummy lines DML2, and the second power auxiliary line VSAL may be disposed as the third source-drain conductive layer on the second planarization layer 128.

For example, the four light emitting pixel drivers EPD may be arranged between any two adjacent light sensing pixel drivers DPD in the first direction DR1.

Here, the two second dummy lines DML2 respectively paired with the two data lines DL may be disposed between the two data lines DL respectively electrically connected to any two neighboring light emitting pixel drivers EPD adjacent to the light sensing pixel driver DPD among the four light emitting pixel drivers EPD. Further, the second power auxiliary line VSAL may be disposed between the two second dummy lines DML2. In addition, the two data lines DL respectively electrically connected to any two neighboring light emitting pixel drivers EPD relatively spaced apart from the light sensing pixel driver DPD among the four light emitting pixel drivers EPD may neighbor each other.

The read-out line ROL may include a read-out lower line ROBL and a read-out upper line ROTL that overlap each other.

The read-out upper line ROTL may be disposed on the same layer as the data line DL, the second dummy line DML2, and the second power auxiliary line VSAL.

The read-out lower line ROBL may be disposed on the same layer as the first power line VDL. As an example, the read-out lower line ROBL and the first power line VDL may be disposed as the second source-drain conductive layer on the first planarization layer 127.

Referring to FIG. 12, in the circuit layer 120 of the display device 100 according to embodiments, the reset control line GRL and the first dummy line DML1 may extend in the first direction DR1 intersecting the data lines DL.

Further, the scan write line GWL, the scan initialization line GIL, the emission control line ECL, the gate control line GCL, the bias control line GBL, the first initialization power line VIL, the second initialization power line VAIL, and the reset voltage line VRL may extend in the first direction DR1.

The third transistor T3, the fourth transistor T4, and the tenth transistor T10, which are provided as N-type MOSFETs, may be provided in a structure including a bottom gate electrode disposed below the channel portion and a top gate electrode disposed above the channel portion.

To this end, the gate control line GCL electrically connected to the gate electrode of the third transistor T3 may include a gate control lower line GCBL and a gate control upper line GCTL that overlap each other.

The scan initialization line GIL electrically connected to the gate electrode of the fourth transistor T4 may include a scan initialization lower line GIBL and a scan initialization upper line GITL that overlap each other.

The reset control line GRL electrically connected to the gate electrode of the tenth transistor T10 may include a reset control lower line GRBL and a reset control upper line GRTL that overlap each other.

The light emitting element LE of the first emission area EA1, which emits light of the first color in a relatively high wavelength band, may be initialized to a voltage level different from those of the light emitting element LE of the second emission area EA2, which emits light of the second color, and the light emitting element LE of the third emission area EA3, which emits light of the third color.

To this end, the second initialization power line VAIL may include a red second initialization power line VAIL_R that transmits a red second initialization power for the first emission area EA1 for red, and a blue-green second initialization power line VAIL_GB that transmits the blue-green second initialization power for the second emission area EA2 for green and the third emission area EA3 for blue.

For example, the scan write line GWL, the emission control line ECL, and the bias control line GBL may be disposed as the first gate conductive layer on the first gate insulating layer 122.

The gate control lower line GCBL, the scan initialization lower line GIBL, and the reset control lower line GRBL may be disposed as a second gate conductive layer on the second gate insulating layer 123.

The gate control upper line GCTL, the scan initialization upper line GITL, the reset control upper line GRTL, and the second initialization power line VAIL (VIAL_R and VIAL_GB) may be disposed as third gate conductive layers on the third gate insulating layer 125.

The first dummy lines DML1, the first initialization power line VIL, the reset voltage line VRL, and the bias power line VBL may be disposed as a first source-drain conductive layer on the second interlayer insulating layer 126.

According to embodiments, the reset control line GRL overlaps at least some first dummy lines DML1 among the first dummy lines DML1. That is, the reset control line GRL overlaps at least the first transmission bypass line TDEL1 among the first dummy lines DML1.

Figure 13:
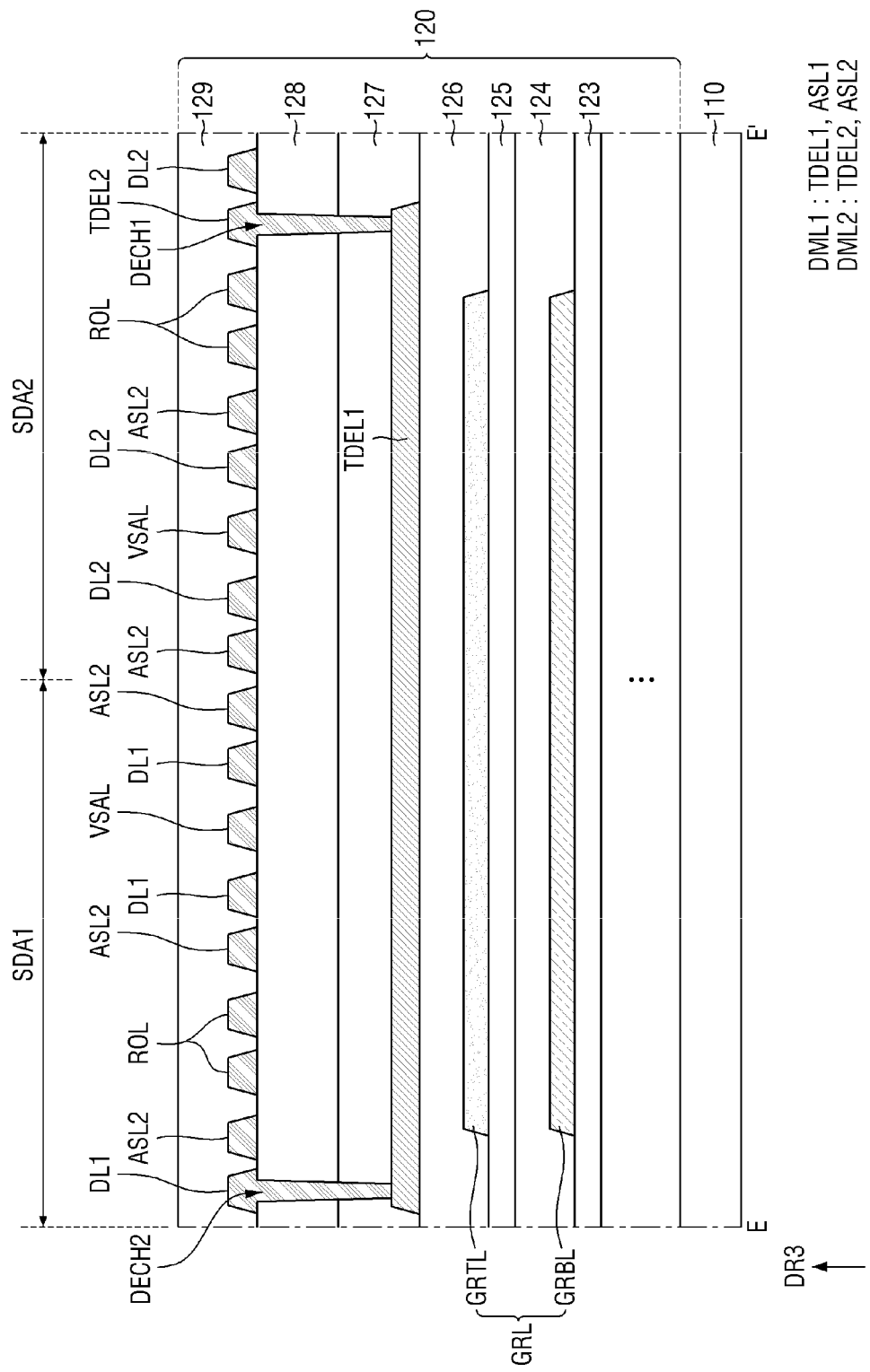
FIG. 13 is a cross-sectional view taken along line E-E' of FIG. 9.

FIG. 13 is a cross-sectional view taken along line E-E' of FIG. 10.

Referring to FIG. 13, the second dummy lines DML2 including the second transmission bypass line TDEL2 and a second auxiliary line ASL2 may be disposed as the third source-drain conductive layer on the second planarization layer 128, in the same way as the data lines DL.

The first dummy lines DML1 including the first transmission bypass line TDEL1 may be disposed as a conductive layer under the second planarization layer 128.

For example, the first dummy lines DML1 including the first transmission bypass line TDEL1 may be disposed as the first source-drain conductive layer on the second interlayer insulating layer 126, and may be covered with the first planarization layer 127.

In this case, the first bypass connection hole DECH1 and the second bypass connection hole DECH2 may extend through the second planarization layer 128 and the first planarization layer 127.

In addition, according to embodiments, at least the first transmission bypass line TDEL1 among the first dummy lines DML1 overlaps the reset control line GRL.

The reset control line GRL may include the reset control lower line GRBL and the reset control upper line GRTL that overlap each other.

In this case, at least apart of the first transmission bypass line TDEL1 on the second interlayer insulating layer 126 may overlap the reset control upper line GRTL on the third gate conductive layer 125.

Alternatively, at least a part of the first transmission bypass line TDEL1 on the second interlayer insulating layer 126 may overlap not only the reset control upper line GRTL on the third gate conductive layer 125 but also the reset control lower line GRBL on the second gate conductive layer 123.

As such, according to embodiments, the first dummy lines DML1 including the first transmission bypass line TDEL1 do not overlap lines in the first direction DR1 to which a plurality of pulse signals are applied during each image frame period, similarly to the scan write line GWL, the scan initialization line GIL, the emission control line ECL, the gate control line GCL, and the bias control line GBL.

Accordingly, the data signal of the first transmission bypass line TDEL1 may be prevented from being distorted due to the influence of a pulse signal applied multiple times during each image frame period.

Further, according to embodiments, the first dummy lines DML1 including the first transmission bypass line TDEL1 do not overlap the first initialization power line VIL and the second initialization power line VIAL for initializing the light emitting pixel drivers EPD, and the reset voltage line VRL for resetting the light sensing pixel drivers DPD.

Accordingly, the voltage levels of the first initialization power VINT, the second initialization power VAINT, and the reset voltage VRST may be prevented from varying with the data signal of the first transmission bypass line TDEL1. Accordingly, initialization of the light emitting pixel drivers EPD and reset of the light sensing pixel drivers DPD may be prevented from being performed partially differently, so that image quality degradation due to spot defects or the like may be prevented.

According to embodiments, in order to prevent the data signal of the first transmission bypass line TDEL1 from being distorted due to the voltage level of the reset control line GRL overlapping the first transmission bypass line TDEL1, the voltage level of the reset control line GRL may be maintained at a constant voltage during each image frame period.

Figure 14:
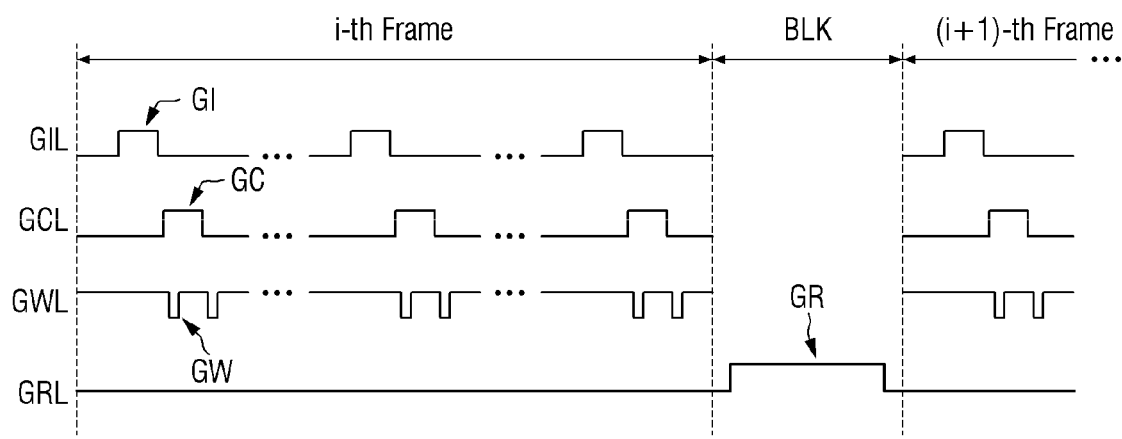
FIGS. 14 and 15 are waveform diagrams illustrating voltage levels of each of the scan initialization line, the gate control line, the scan write line, and the reset control line of FIG. 7 according to one embodiment.
Figure 15:
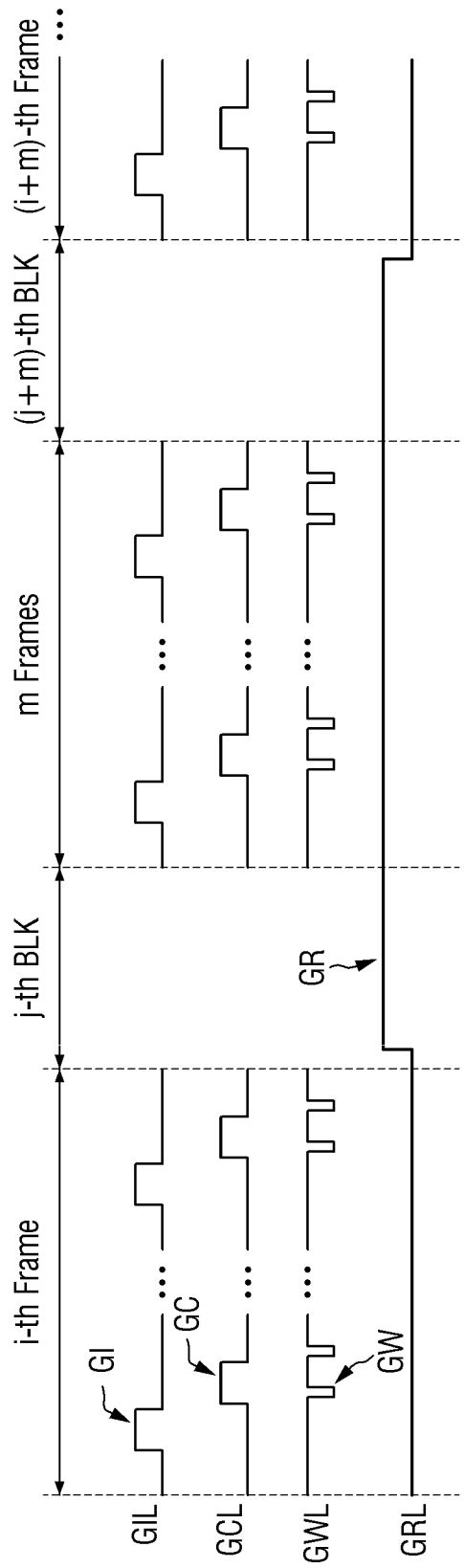

FIGS. 14 and 15 are waveform diagrams illustrating voltage levels of each of the scan initialization line, the gate control line, the scan write line, and the reset control line of FIG. 7 according to one embodiment.

Referring to FIGS. 14 and 15, during each of image frame periods i-th Frame and (i+1)-th Frame, the scan write signal GW may be transmitted to the light emitting pixel drivers EPD and the light sensing pixel drivers DPD through the scan write line GWL.

In addition, during each of the image frame periods i-th Frame and (i+1)-th Frame, the gate control signal GC, through the gate control line GCL, and the scan initialization signal GI, through the scan initialization line GIL, may be transmitted to the light emitting pixel drivers EPD.

A blank period BLK may be disposed between consecutive image frame periods i-th Frame and (i+1)-th Frame.

During the blank period BLK, the voltage level of the scan write line GWL may be maintained at a turn-off level.

According to some embodiments, the voltage level of the reset control line GRL may vary during the blank period BLK.

For example, as illustrated in FIG. 14, the reset control signal GR of the reset control line GRL may be transmitted to the light sensing pixel drivers DPD during the blank period BLK between the consecutive image frame periods i-th Frame and (i+1)-th Frame (where i is a natural number greater than or equal to 1).

That is, during the blank period BLK between the consecutive image frame periods i-th Frame and (i+1)-th Frame, the voltage level of the reset control line GRL may be varied twice into a rising form and a falling form by the reset control signal GR.

In this case, during each of the image frame periods i-th Frame and (i+1)-th Frame, the voltage level of the reset control line GRL may be maintained at the turn-off level after a falling form.

For another example, as illustrated in FIG. 15, the voltage level of the reset control line GRL may vary into a rising form during a first blank period j-th BLK, and may vary into a falling form during a second blank period (j+m)-th Frame after the first blank period j-th BLK (where each of i, j, and m is a natural number greater than or equal to 1). Further, between the first blank period j-th BLK and the second blank period (j+m)-th Frame, at least one image frame period m Frames may be disposed.

In this case, during at least one image frame period m Frames between the first blank period j-th BLK and the second blank period (j+m)-th Frame, the voltage level of the reset control line GRL may be maintained at a turn-on level after a rising form.

On the other hand, during the image frame period i-th Frame before the first blank period j-th BLK and the image frame period (j+m)-th Frame after the second blank period (j+m)-th Frame, the voltage level of the reset control line GRL may be maintained at the turn-off level.

As described above, according to the embodiments, the voltage level of the reset control line GRL varies only during the blank period BLK, so that during each of the image frame periods i-th Frame, (i+1)-th Frame, and (j+m)-th Frame, the voltage level of the reset control line GRL may be maintained at a constant voltage at the turn-on level or at a constant voltage at the turn-off level.

Accordingly, the data signal of the first transmission bypass line TDEL1 overlapping the reset control line GRL may be prevented from being distorted due to the influence of the voltage level of the reset control line GRL.

Meanwhile, FIGS. 14 and 15 illustrate that the scan initialization signal GI, the gate control signal GC, and the reset control signal GR are at a high level and the turn-off levels thereof are at a low level, but this is an example of a case in which the third transistor T3, the fourth transistor T4, and the tenth transistor T10 are N-type MOSFETs. That is, when the third transistor T3, the fourth transistor T4, and the tenth transistor T10 are provided as P-type MOSFETs, the scan initialization signal GI, the gate control signal GC, and the reset control signal GR may be at a low level.

In addition, FIGS. 14 and 15 illustrate that the scan write signal GW is at a low level and the turn-off level of the scan write signal GW is at a high level, but this is an example of a case in which the second transistor T2 and the eleventh transistor T11 are N-type MOSFETs. That is, when the second transistor T2 and the eleventh transistor T11 are provided as P-type MOSFETs, the scan write signal GW may be at a high level.

Figure 16:
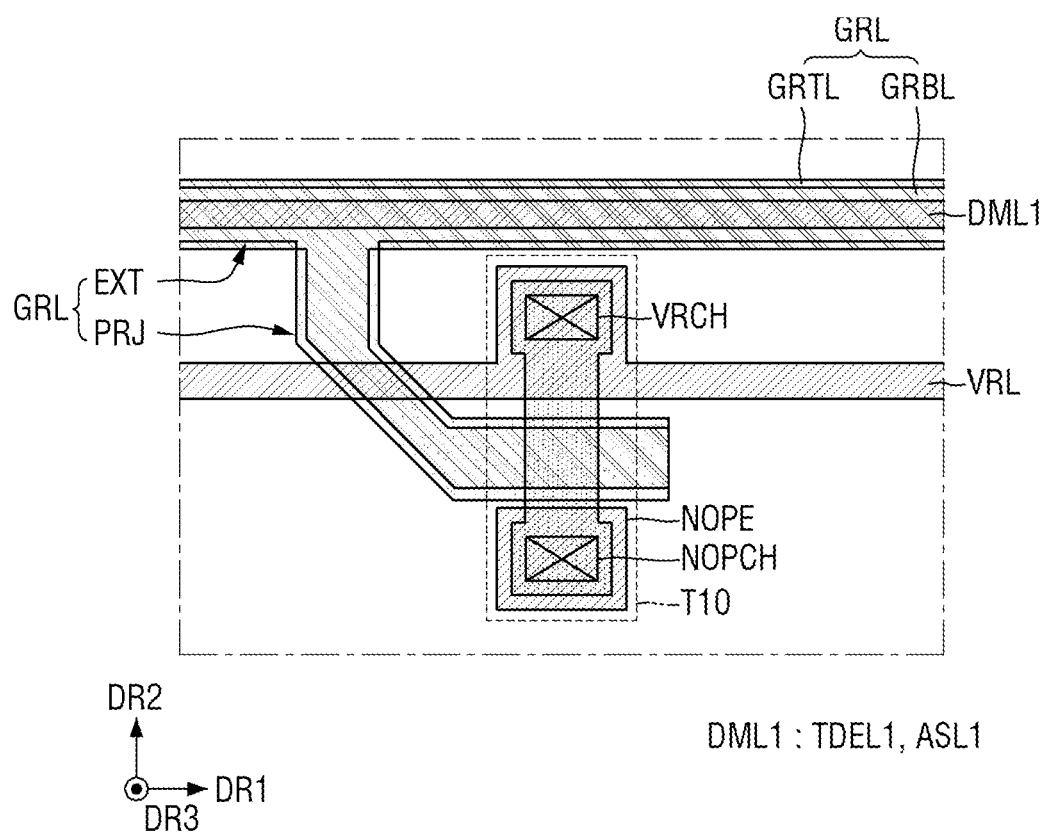
FIGS. 16 and 17 are plan views illustrating a reset control line, a first dummy line, and a tenth transistor according to one embodiment.
Figure 17:
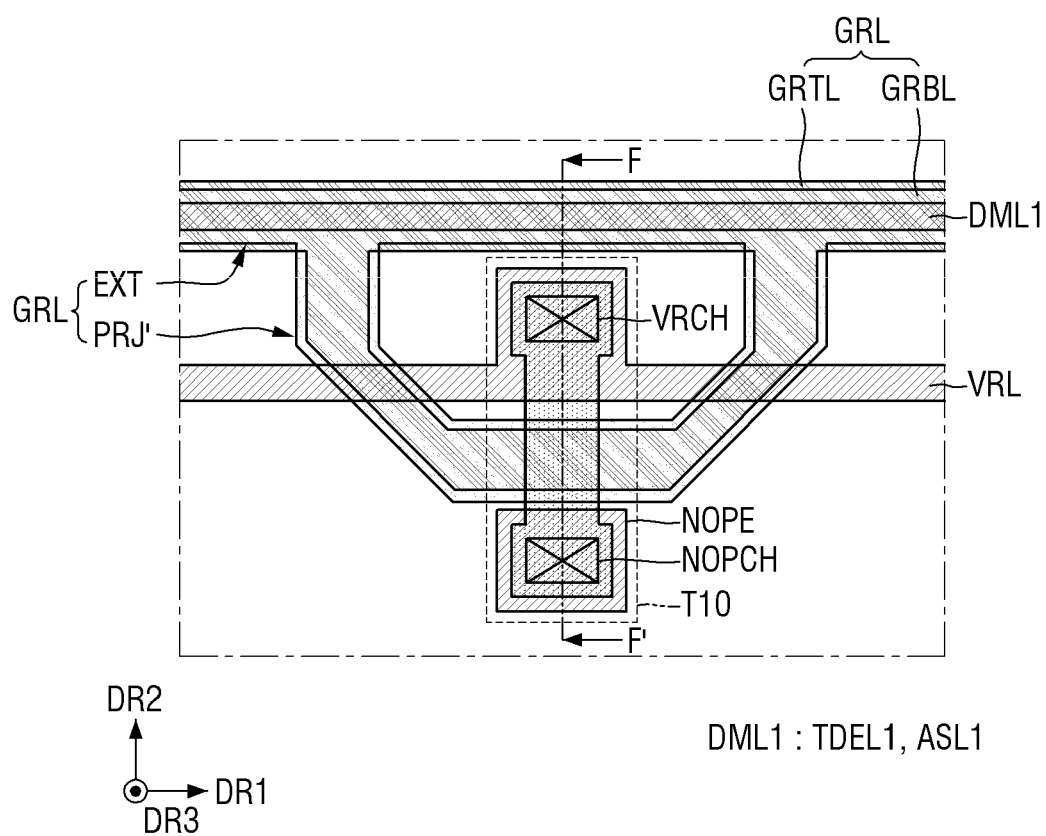
Figure 18:
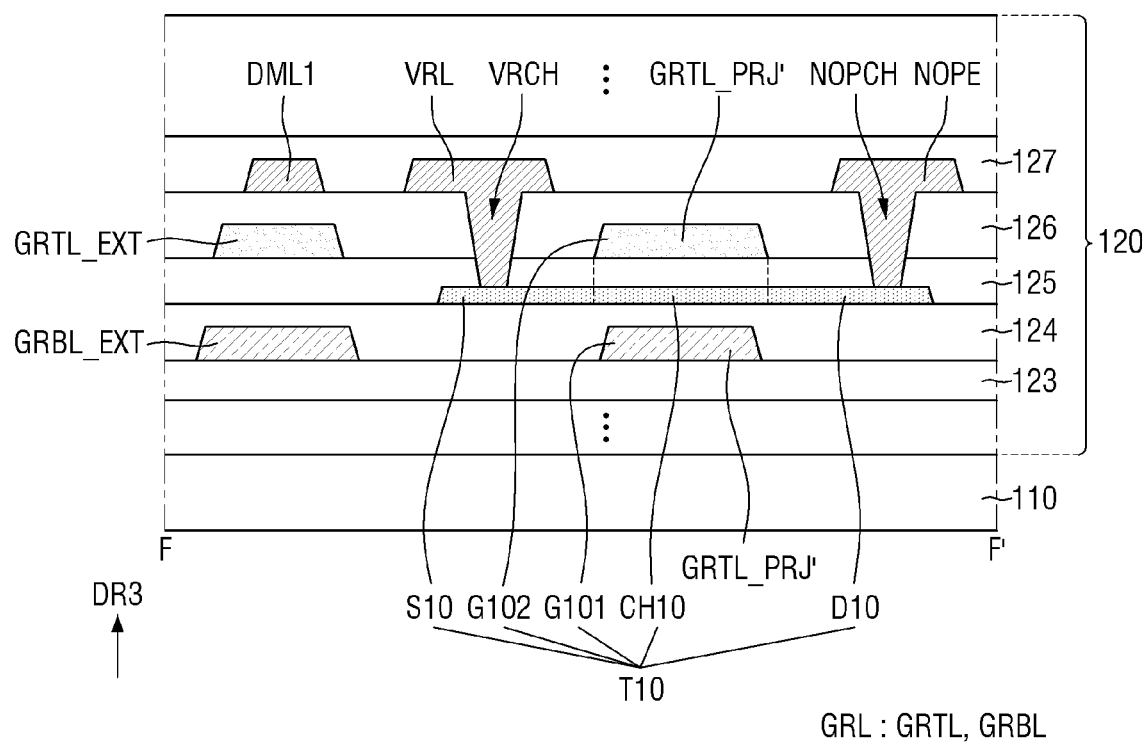
FIG. 18 is a cross-sectional view taken along line F-F' of FIG. 17.

FIGS. 16 and 17 are plan views illustrating a reset control line, a first dummy line, and a tenth transistor according to one embodiment. FIG. 18 is a cross-sectional view taken along line F-F' of FIG. 17.

Referring to FIGS. 16 and 17, the reset control line GRL according to one embodiment may include an extension portion EXT extending in the first direction DR1 and protrusions PRJ and PRJ' branching out from the extension portion EXT and overlapping the channel portion of the tenth transistor T10.

The first dummy line DML1 including the first transmission bypass line TDEL1 may overlap the extension portion EXT of the reset control line GRL.

In this way, malfunction of the tenth transistor T10 due to the influence of the data signal of the first transmission bypass line TDEL1 may be reduced.

The reset control line GRL may include the reset control lower line GRBL and the reset control upper line GRTL that overlap each other. In this case, each of the reset control lower line GRBL and the reset control upper line GRTL may include the extension portion EXT and the protrusions PRJ and PRJ'.

For example, as illustrated in FIG. 16, the protrusion PRJ of the reset control line GRL may be disposed such that one side thereof is connected to the extension portion EXT.

In another embodiment, as illustrated in FIG. 17, the protrusion PRJ' of the reset control line GRL may be disposed such that there are two connection points to the extension portion EXT. That is, the protrusion PRJ' of the reset control line GRL may form a loop with a part of the extension portion EXT. In this way, the connection between the extension portion EXT and the protrusion PRJ' may be secured more stably, and the voltage level of the protrusion PRJ' may be easily maintained the same as that of the extension portion EXT.

As illustrated in FIG. 18, the tenth transistor T10 may include a channel portion CH10, a source portion S10, and a drain portion D10 made of a second semiconductor layer on the first interlayer insulating layer 124, a top gate electrode G101 disposed above the channel portion CH10, and a bottom gate electrode G102 disposed below the channel portion CH10.

The channel portion CH10 of the tenth transistor T10 may overlap the top gate electrode G101 and the bottom gate electrode G102.

The bottom gate electrode G102 of the tenth transistor T10 may be provided as a protrusion GRBL_PRJ' of the reset control lower line GRBL disposed as the second gate conductive layer on the second gate insulating layer 123.

The top gate electrode G101 of the tenth transistor T10 may be provided as a protrusion GRTL_PRJ' of the reset control upper line GRTL disposed as the third gate conductive layer on the third gate insulating layer 125.

The source portion S10 of the tenth transistor T10 may be electrically connected to a reset voltage line VRL through a reset voltage connection hole VRCH.

The drain portion D10 of the tenth transistor T10 may be electrically connected to an output node connection electrode NOPE through an output node connection hole NOPCH.

An extension portion GRTL_EXT of the reset control upper line GRTL may overlap the first dummy line DML1 including the first transmission bypass line TDEL1.

However, the effects of the present disclosure are not restricted to the one set forth herein. The above and other effects of the present disclosure will become more apparent to one of daily skill in the art to which the present disclosure pertains by referencing the claims.

What is claimed is:

1. A display device comprising:
   a substrate;
   a circuit layer disposed on the substrate; and
   an element layer disposed on the circuit layer,
   wherein the substrate comprises a display area in which emission areas are arranged, and a non-display area disposed around the display area,
   the display area comprises a non-emission area between the emission areas, and light sensing areas disposed in the non-emission area,
   the element layer comprises light emitting elements disposed in the emission areas and light sensing elements respectively disposed in the light sensing areas, and
   the circuit layer comprises:
   light emitting pixel drivers electrically connected to the light emitting elements;
   light sensing pixel drivers electrically connected to the light sensing elements;
   data lines electrically connected to the light emitting pixel drivers;

first dummy lines extending in a first direction intersecting the data lines;

second dummy lines extending parallel to the data lines, each of the second dummy lines paired with one of the data lines; and a reset control line electrically connected to the light sensing pixel drivers, extending in the first direction, transmitting a reset control signal for resetting the light sensing pixel drivers, and overlapping at least one of the first dummy lines.

2. The display device of claim 1, further comprising a display driving circuit outputting data signals to the data lines, wherein the circuit layer further comprises data supply lines disposed in the non-display area, and electrically connected between the data lines and the display driving circuit, a bypass area on one side of the display area comprises a bypass middle area at a center of the bypass area, a first bypass side area between the bypass middle area and the non-display area, and a second bypass side area disposed between the bypass middle area and the first bypass side area, the data lines comprise a first data line disposed in the first bypass side area, and a second data line disposed in the second bypass side area, the first dummy lines comprise a first transmission bypass line electrically connected to the first data line, the second dummy lines comprise a second transmission bypass line paired with the second data line and electrically connected to the first transmission bypass line, among the data supply lines, a first data supply line transmitting the data signal to the first data line is electrically connected to the first data line through the first transmission bypass line and the second transmission bypass line, among the data supply lines, a second data supply line transmitting the data signal of the second data line is directly electrically connected to the second data line, and among the first dummy lines, the first transmission bypass line overlaps the reset control line.

3. The display device of claim 2, wherein the circuit layer further comprises:

a first power supply line and a second power supply line disposed in the non-display area, and transmitting a first power and a second power for driving the light emitting elements, respectively; and a first power line electrically connected between the light emitting pixel drivers and the first power supply line, one of the light emitting elements is electrically connected between one of the light emitting pixel drivers and the second power, and the one light emitting pixel driver comprises:

a first transistor generating a driving current for driving the one light emitting element;

a second transistor electrically connected between one of the data lines and a first electrode of the first transistor;

a third transistor electrically connected between a gate electrode of the first transistor and a second electrode of the first transistor;

a fourth transistor electrically connected between a first initialization power line for transmitting a first initialization power and the gate electrode of the first transistor;

a fifth transistor electrically connected between the first power line and the first electrode of the first transistor;

a sixth transistor electrically connected between the second electrode of the first transistor and the one light emitting element;

a seventh transistor electrically connected between a second initialization power line for transmitting a second initialization power and the one light emitting element; and an eighth transistor electrically connected between a bias power line for transmitting a bias power and the first electrode of the first transistor.

4. The display device of claim 3, wherein the circuit layer further comprises a read-out line electrically connected to the light sensing pixel drivers, one of the light sensing elements is electrically connected between an element output node of one of the light sensing pixel drivers and the second power, and the one light sensing pixel driver comprises:

a ninth transistor configured to be turned on in response to a voltage level of the element output node;

a tenth transistor electrically connected between a reset voltage line for transmitting a reset voltage and the element output node, and configured to be turned on in response to the reset control signal of the reset control line; and an eleventh transistor electrically connected between the read-out line and the ninth transistor.

5. The display device of claim 4, wherein the second transistor and the eleventh transistor are turned on in response to a scan write signal of a scan write line, the scan write signal is transmitted to the light emitting pixel drivers and the light sensing pixel drivers during each image frame, a blank period in which a voltage level of the scan write line is maintained at a turn-off level is disposed between consecutive image frame periods, and a voltage level of the reset control line varies during the blank period.

6. The display device of claim 5, wherein the reset control signal of the reset control line is transmitted to the light sensing pixel drivers during the blank period between consecutive image frame periods.

7. The display device of claim 5, A voltage level of the reset control line varies in a first form during a first blank period, and varies in a second form opposite to the first form during a second blank period after the first blank period, and at least one image frame period is disposed between the first blank period and the second blank period.

8. The display device of claim 5, wherein the third transistor is turned on in response to a gate control signal of a gate control line, the fourth transistor is turned on in response to a scan initialization signal of a scan initialization line, and the gate control signal and the scan initialization signal are transmitted to all of the light emitting pixel drivers during each image frame period.

9. The display device of claim 5, wherein the reset control line comprises:

an extension portion extending in the first direction; and a protrusion branching out from the extension portion and overlapping a channel portion of the tenth transistor.

10. The display device of claim 9, wherein the protrusion forms a loop with two connection points to the extension portion.

11. The display device of claim 2, wherein the first dummy lines further comprise first auxiliary lines electrically connected to the second power supply line, and the second dummy lines further comprise second auxiliary lines electrically connected to the first auxiliary lines and the second power supply line.

12. The display device of claim 11, wherein two of the first auxiliary lines extend from both sides of the first transmission bypass line to the non-display area, and one of the second auxiliary lines extends from one side of the second transmission bypass line to the non-display area.

13. A display device comprising:

a substrate;

a circuit layer disposed on the substrate; and an element layer disposed on the circuit layer, wherein the substrate comprises a display area in which emission areas are arranged, and a non-display area disposed around the display area, the display area comprises a non-emission area between the emission areas, and light sensing areas disposed in the non-emission area, the element layer comprises light emitting elements disposed in the emission areas and light sensing elements respectively disposed in the light sensing areas, a bypass area on one side of the display area comprises a bypass middle area at a center of the bypass area, a first bypass side area between the bypass middle area and the non-display area, and a second bypass side area disposed between the bypass middle area and the first bypass side area, and the circuit layer comprises:

light emitting pixel drivers electrically connected to the light emitting elements, respectively;

light sensing pixel drivers electrically connected to the light sensing elements, respectively;

data lines electrically connected to the light emitting pixel drivers;

a first transmission bypass line extending in the first direction crossing the data lines, and electrically connected to a first data line disposed in the first bypass side area among the data lines;

a second transmission bypass line extending parallel to the data lines, paired with a second data line disposed in the second bypass side area among the data lines, and electrically connected to the first transmission bypass line; and a reset control line electrically connected to the light sensing pixel drivers, extending in the first direction, transmitting a reset control signal for resetting an element output node of each of the light sensing pixel drivers, and overlapping the first transmission bypass line.

14. The display device of claim 13, further comprising a display driving circuit outputting data signals of the data lines, wherein the circuit layer further comprises data supply lines disposed in the non-display area, and electrically connected between the data lines and the display driving circuit, among the data supply lines, a first data supply line transmitting the data signal to the first data line is electrically connected to the first data line through the first transmission bypass line and the second transmission bypass line, and among the data supply lines, a second data supply line transmitting the data signal to the second data line is directly electrically connected to the second data line.

15. The display device of claim 14, wherein the circuit layer further comprises a read-out line electrically connected to the light sensing pixel drivers, one of the light emitting elements is electrically connected between one of the light emitting pixel drivers and the second power, one of the light sensing elements is electrically connected between an element output node of one of the light sensing pixel drivers and the second power, the one light emitting pixel driver comprises:

a first transistor generating a driving current for driving the one light emitting element;

a second transistor electrically connected between one of the data lines and a first electrode of the first transistor;

a third transistor electrically connected between a gate electrode of the first transistor and a second electrode of the first transistor;

a fourth transistor electrically connected between a first initialization power line for transmitting a first initialization power and the gate electrode of the first transistor;

a fifth transistor electrically connected between a first power line for transmitting the first power and the first electrode of the first transistor;

a sixth transistor electrically connected between the second electrode of the first transistor and the one light emitting element;

a seventh transistor electrically connected between a second initialization power line for transmitting a second initialization power and the one light emitting element; and an eighth transistor electrically connected between a bias power line for transmitting a bias power and the first electrode of the first transistor, and the one light sensing pixel driver comprises:

a ninth transistor configured to be turned on in response to a voltage level of the element output node;

a tenth transistor electrically connected between a reset voltage line for transmitting a reset voltage and the element output node, and configured to be turned on in response to the reset control signal of the reset control line; and an eleventh transistor electrically connected between the read-out line and the ninth transistor.

16. The display device of claim 15, wherein the second transistor and the eleventh transistor are turned on in response to a scan write signal of a scan write line, the scan write signal is transmitted to the light emitting pixel drivers and the light sensing pixel drivers during each image frame, a blank period in which a voltage level of the scan write line is maintained at a turn-off level is disposed between consecutive image frame periods, and a voltage level of the reset control line varies during the blank period.

17. The display device of claim 16, wherein a voltage level of the reset control line varies in a first form during a first blank period, and varies in a second form opposite to the first form during a second blank period after the first blank period, and at least one image frame period is disposed between the first blank period and the second blank period.

18. The display device of claim 16, wherein the reset control line comprises:
an extension portion extending in the first direction; and
a protrusion branching out from the extension portion and overlapping a channel portion of the tenth transistor.

19. The display device of claim 18, wherein the protrusion forms a loop with two connection points to the extension portion.

* * * * *